(12) United States Patent
Zeng et al.

(10) Patent No.: US 11,011,509 B2
(45) Date of Patent: May 18, 2021

(54) ELECTROSTATIC DISCHARGE PROTECTION DEVICE

(71) Applicant: GLOBALFOUNDRIES Singapore Pte. Ltd., Singapore (SG)

(72) Inventors: Jie Zeng, Singapore (SG); Raunak Kumar, Singapore (SG); Kyong Jin Hwang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/574,184

(22) Filed: Sep. 18, 2019

(65) Prior Publication Data

US 2021/0082905 A1   Mar. 18, 2021

(51) Int. Cl.
  *H01L 27/02*   (2006.01)
  *H01L 27/092*   (2006.01)
  *H01L 29/735*   (2006.01)

(52) U.S. Cl.
  CPC ...... *H01L 27/0262* (2013.01); *H01L 27/0928* (2013.01); *H01L 29/735* (2013.01)

(58) Field of Classification Search
  CPC ............. H01L 27/0262; H01L 27/0292; H01L 27/0928; H01L 29/735
  See application file for complete search history.

(56) References Cited

U.S. PATENT DOCUMENTS

| | | |
|---|---|---|
| 5,602,409 A | 2/1997 | Olney |
| 7,193,251 B1 | 3/2007 | Vashchenko et al. |
| 7,639,464 B1 | 12/2009 | Vashchenko et al. |
| 7,723,823 B2 | 5/2010 | Gill et al. |
| 7,868,423 B2 | 1/2011 | Benoit et al. |
| 9,018,072 B2 | 4/2015 | Gendron et al. |
| 2014/0203368 A1* | 7/2014 | Zeng ............... H01L 29/47 257/355 |

OTHER PUBLICATIONS

Vashchenko et al., "Multi-Port ESD Protection Using Bi-Directional SCR Structures", 2003 Proceedings of the Bipolar/BiCMOS Circuits and Technology Meeting, 2003, pp. 137-140, IEEE.

(Continued)

*Primary Examiner* — Seahvosh Nikmanesh
(74) *Attorney, Agent, or Firm* — Viering Jentschura & Partner MBB

(57) ABSTRACT

An ESD protection device may include a substrate, a first conductivity region arranged at least partially within the substrate, a second conductivity region arranged at least partially within the first conductivity region, third and fourth conductivity regions arranged at least partially within the second conductivity region, and first and second terminal portions arranged at least partially within the third and fourth conductivity regions respectively. The third and fourth conductivity regions may be spaced apart from each other. The substrate and the second conductivity region may have a first conductivity type. The first conductivity region, third conductivity region, fourth conductivity region and first and second terminal portions may have a second conductivity type different from the first conductivity type. The first and second terminal portions may have higher doping concentrations than the third and fourth conductivity regions respectively.

20 Claims, 14 Drawing Sheets

(56) References Cited

OTHER PUBLICATIONS

Vashchenko et al., "Implementation of 60V Tolerant Dual Direction ESD Protection in 5V BiCMOS Process for Automotive Application", 2004 Electrical Overstress/Electrostatic Discharge Symposium, 2004, 8 pages, IEEE.

Vashchenko et al., "Implementation of Dual-Direction SCR Devices in Analog CMOS Process", 2007 29th Electrical Overstress/Electrostatic Discharge Symposium, 2007, 5 pages, IEEE.

De Heyn et al., "Design and Analysis of New Protection Structures for Smart Power Technology with Controlled Trigger and Holding Voltage", 2001 IEEE International Reliability Physics Symposium Proceedings. 39th Annual, 2001, pp. 253-258, IEEE.

Xiu et al., "Improving the Long Pulse Width Failure Current of NPN in BiCMOS Technology", 2016 IEEE International Reliability Physics Symposium (IRPS), 2016, 4 pages, IEEE.

\* cited by examiner

ELECTROSTATIC DISCHARGE PROTECTION DEVICE

TECHNICAL FIELD

The present disclosure relates generally to electrostatic discharge (ESD) protection devices and methods for forming the ESD protection devices.

BACKGROUND

Electronic apparatuses can be damaged by ESD voltages higher than the usual voltages supplied to these apparatuses. Accordingly, the electronic apparatuses are often coupled to ESD protection devices to protect them against such damage.

FIG. 1A shows a cross-sectional view of a prior art ESD protection device 100 including a high voltage npn device. As shown in FIG. 1A, the device 100 includes a deep N type well (Deep NWell) 104 arranged over a P type substrate (P-Sub) 102. The device 100 further includes an N type well (Well) 106 and a P type well (PWell) 108 arranged within the deep N type well 104. A collector portion 110 is arranged within the N type well 106, and a base portion 112 and an emitter portion 114 are arranged within the P type well 108. These portions 110, 112, 114 are isolated from each other and from the sides of the device 100 by isolation regions 116. Further, the collector portion 110 is connected to a collector terminal 118, whereas the base portion 112 and the emitter portion 114 are shorted and are connected to an emitter/base terminal 120. FIG. 1B shows an equivalent circuit of the ESD protection device 100. Referring to FIG. 1B, the shorting of the base portion 112 and the emitter portion 114 of the npn device 100 allows the device 100 to act as a diode between the collector and emitter/base terminals 118, 120. In use, an apparatus to be protected is connected to the collector and emitter/base terminals 118, 120 of the ESD protection device 100. The voltage between these terminals 118, 120 may be referred to as the ESD voltage. When the ESD voltage is below a predefined level, negligible current flows through the npn device 100. However, when the ESD voltage exceeds the predefined level, the npn device 100 turns on to conduct current away from the apparatus, hence protecting the apparatus from damage.

The prior art ESD protection device 100 can only support uni-directional (or in other words, single polarity) high voltage bias. Said differently, the prior art device 100 can sustain a high voltage bias in only one direction. For example, referring to FIGS. 1A and 1B, the high voltage bias can only be applied in the direction from the emitter/base terminal 120 to the collector terminal 118 for the device 100 to operate as an effective ESD protection device. Otherwise, if the voltage at the emitter/base terminal 120 is much higher (e.g. more than 0.7V higher) than the voltage at the collector terminal 118, the device 100 is forward biased and may turn on to conduct current away from the apparatus, even when the voltage bias between the terminals 118, 120 is below the above-mentioned predefined level.

To form an ESD protection device that can support bi-directional (or in other words, dual polarity) high voltage bias, two npn devices 100 may be coupled together. FIG. 1C shows an equivalent circuit of a prior art ESD protection device 120 that can support bi-directional high voltage bias. As shown in FIG. 1C, the ESD protection device 120 includes a back to back stack of the npn devices 100. In particular, the ESD protection device 120 includes two npn devices 100 connected to each other via their collectors 110. This forms two diodes biased in opposite directions, allowing the device 120 to sustain bi-directional high voltage bias. However, such an ESD protection device 120 is large as its silicon footprint is almost double that of the npn device 100 of FIGS. 1A and 1B. Further, due to the stacking of the npn devices 100, the clamping ability of the ESD protection device 120 tends to be poor and the on-resistance of the ESD protection device 120 tends to be high.

Accordingly, it is desirable to provide a smaller ESD protection device with better clamping ability and lower on-resistance that can support bi-directional high voltage bias.

SUMMARY

According to various non-limiting embodiments, there may be provided an electrostatic discharge (ESD) protection device including: a substrate; a first conductivity region arranged at least partially within the substrate; a second conductivity region arranged at least partially within the first conductivity region; a third conductivity region and a fourth conductivity region arranged at least partially within the second conductivity region; and a first terminal portion arranged at least partially within the third conductivity region and a second terminal portion arranged at least partially within the fourth conductivity region. The third conductivity region and the fourth conductivity region may be spaced apart from each other. The substrate and the second conductivity region may have a first conductivity type, and the first conductivity region, third conductivity region, fourth conductivity region, first terminal portion and second terminal portion may have a second conductivity type different from the first conductivity type. The first terminal portion may have a higher doping concentration than the third conductivity region and the second terminal portion may have a higher doping concentration than the fourth conductivity region.

According to various non-limiting embodiments, there may be provided a method including: providing a substrate; forming a first conductivity region at least partially within the substrate; forming a second conductivity region at least partially within the first conductivity region; forming a third conductivity region and a fourth conductivity region at least partially within the second conductivity region; and forming a first terminal portion at least partially within the third conductivity region and a second terminal portion at least partially within the fourth conductivity region. The third conductivity region and the fourth conductivity region may be spaced apart from each other. The substrate and the second conductivity region may have a first conductivity type, and the first conductivity region, third conductivity region, fourth conductivity region, first terminal portion and second terminal portion may have a second conductivity type different from the first conductivity type. The first terminal portion may have a higher doping concentration than the third conductivity region and the second terminal portion may have a higher doping concentration than the fourth conductivity region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1C:
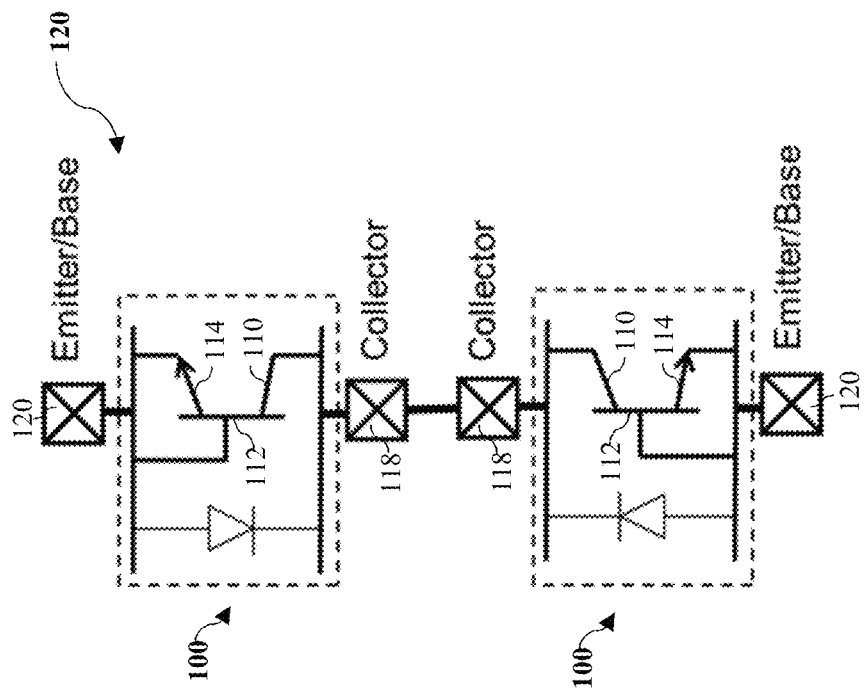
FIG. 1C shows an ESD protection device including two of the devices of FIG. 1A.
Figure 1A:
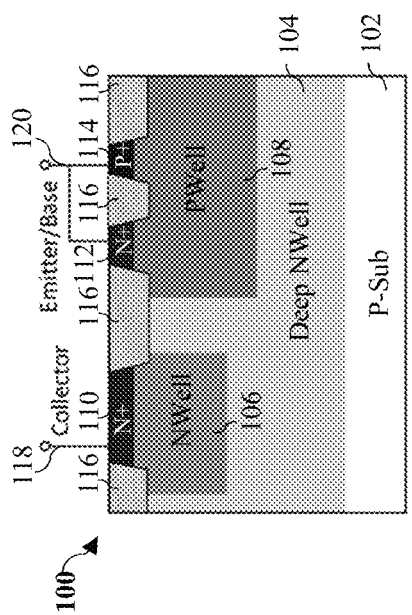
FIG. 1A shows a simplified cross-sectional view of a prior art ESD protection device.
Figure 1B:
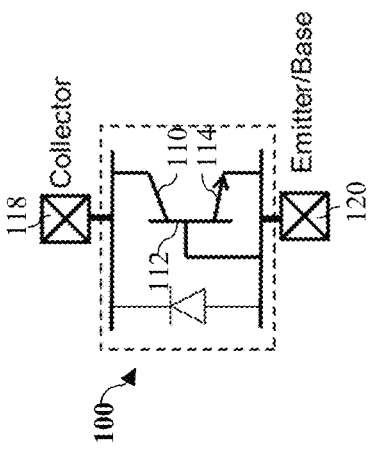
FIG. 1B shows an equivalent circuit of the device of FIG. 1A

The embodiments generally relate to devices, such as semiconductor devices. More particularly, some embodiments relate to ESD protection devices. Such ESD protection devices may, for example, be incorporated into integrated circuits (ICs). The devices or ICs may be used with apparatuses such as, but not limited to, consumer electronic products.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2A:
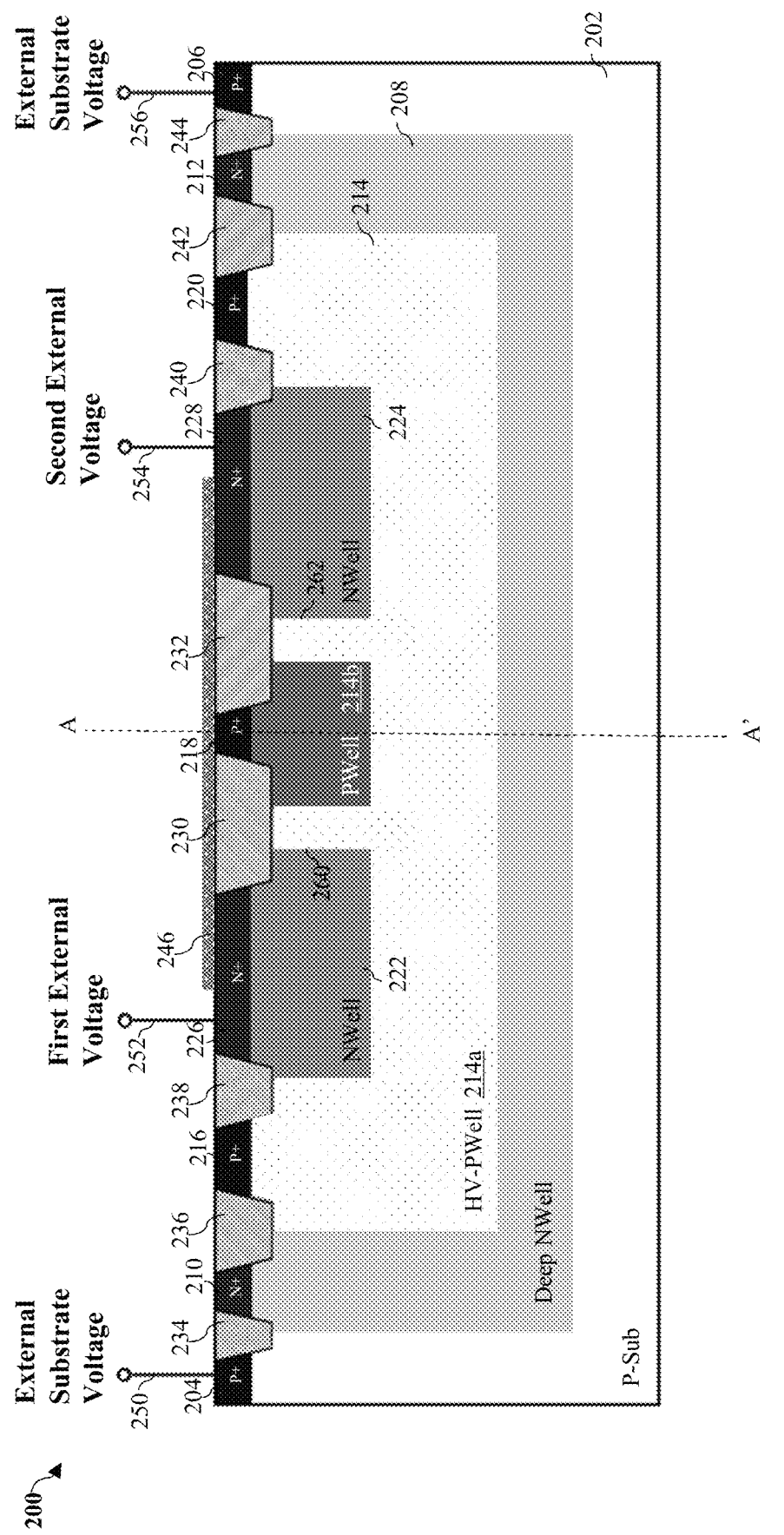
FIG. 2A shows a simplified cross-sectional view of an ESD protection device according to various non-limiting embodiments and FIG. 2B shows an equivalent circuit of the device of FIG. 2A.
Figure 2B:
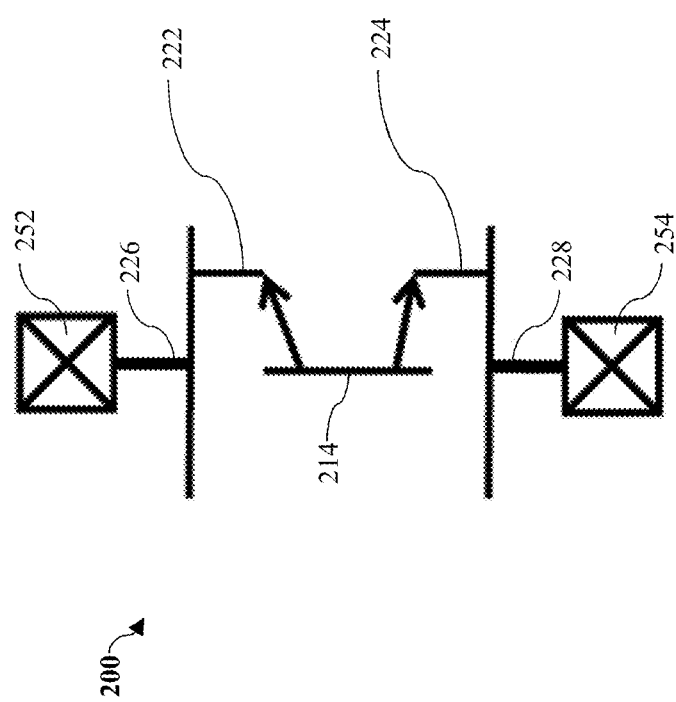

FIG. 2A shows a simplified cross-sectional view of an ESD protection device 200 according to various non-limiting embodiments. FIG. 2B shows an equivalent circuit of the ESD protection device 200. As shown in FIG. 2A, the ESD protection device 200 may be symmetrical about the axis A-A'.

The ESD protection device 200 may include a substrate 202. Substrate terminal portions 204, 206 may be arranged at least partially within the substrate 202. The substrate terminal portions 204, 206 may be configured for connection to external substrate voltages. In an exemplary non-limiting embodiment as shown in FIG. 2A, the substrate terminal portions 204, 206 may be arranged immediately below a top surface of the substrate 202, and may each be connected to an external terminal 250, 256 to which an external substrate voltage may be applied. In various non-limiting embodiments, the substrate terminal portions 204, 206 may have higher doping concentrations (in other words, contain more dopants per unit volume) than the substrate 202. For example, the doping concentration of the substrate 202 may range from about 1E15 cm$^{-3}$ to about 1E16 cm$^{-3}$, and the doping concentration of each substrate terminal portion 204, 206 may range from about 5E19 cm$^{-3}$ to about 5E20 cm$^{-3}$. In various non-limiting embodiments, the substrate 202 and the substrate terminal portions 204, 206 may have a first conductivity type that may be P type. In other words, the substrate 202 and the substrate terminal portions 204, 206 may contain P type dopants. Accordingly, the substrate 202 may include a P type substrate (P-Sub) and the substrate terminal portions may include P+ regions. However, in alternative non-limiting embodiments, the first conductivity type may be N type.

In various non-limiting embodiments, the substrate 202 may include any silicon-containing substrate including, but not limited to, silicon (Si), single crystal silicon, polycrystalline Si, amorphous Si, silicon-on-sapphire (SOS), silicon-on-insulator (SOI) or silicon-on-replacement insulator (SRI) or silicon germanium substrates and the like. Substrate 202 may in addition include various isolations, dopings and/or device features. The substrate 202 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, GaInAsP, or combinations thereof.

The ESD protection device 200 may further include a first conductivity region 208 arranged at least partially within the substrate 202. First conductivity portions 210, 212 may be arranged at least partially within the first conductivity region 208. In an exemplary non-limiting embodiment as shown in FIG. 2A, the first conductivity region 208 may include a deep well and the first conductivity portions 210, 212 may be arranged immediately below a top surface of the substrate 202. Unlike the substrate terminal portions 204, 206, the first conductivity portions 210, 212 may not be configured for connection to any external voltage in various non-limiting embodiments. The first conductivity portions 210, 212 may have higher doping concentrations than the first conductivity region 208, and the first conductivity region 208 may have a higher doping concentration than the substrate 202. For example, the first conductivity region 208 may have a doping concentration ranging from about 5E15 cm$^{-3}$ to about 5E16 cm$^{-3}$, and each first conductivity portion 210, 212 may have a doping concentration ranging from about 5E19 cm$^{-3}$ to about 5E20 cm$^{-3}$. The first conductivity region 208 and the first conductivity portions 210, 212 may have a second conductivity type different from the first conductivity type. In some exemplary non-limiting embodiments, the first conductivity type may be P type and the second conductivity type may be N type. In other words, the first conductivity region 208 and the first conductivity portions 210, 212 may include N type dopants. Accordingly, the first conductivity region 208 may include a deep n-well (Deep Well), and the first conductivity portions 210, 212 may include N+ regions. However, in alternative non-limiting embodiments, the first conductivity type may be N type, and the second conductivity type may be P type.

The ESD protection device 200 may also include a second conductivity region 214 arranged at least partially within the first conductivity region 208. The second conductivity region 214 may include a first segment 214a and a second segment 214b. Second conductivity portions 216, 218, 220 may be arranged at least partially within the second conductivity region 214. In an exemplary non-limiting embodiment as shown in FIG. 2A, the first segment 214a of the second conductivity region 214 may include a high voltage well. The second segment 214b of the second conductivity region 214 may include a well, and the second conductivity portions 216, 218, 220 may be arranged immediately below a top surface of the substrate 202.

Similar to the first conductivity portions 210, 212, the second conductivity portions 216, 218, 220 may not be configured for connection to any external voltage in various non-limiting embodiments. Further, the second conductivity portions 216, 220 may be arranged within the first segment 214a of the second conductivity region 214; whereas, the second conductivity portion 218 may be arranged within the second segment 214b of the second conductivity region 214. The first segment 214a of the second conductivity region 214 may have a higher doping concentration than the first conductivity region 208. The second segment 214b of the second conductivity region 214 may have a higher doping concentration than the first segment 214a of the second conductivity region 214. Providing a more highly doped second segment 214b of the second conductivity region 214 may help to achieve a holding voltage high enough to provide latch-up immunity.

Further, the second conductivity portions 216, 218, 220 may have higher doping concentrations than the first and second segments 214a, 214b of the second conductivity region 214. For example, the first segment 214a of the second conductivity region 214 may have a doping concentration ranging from about 1E16 cm$^{-3}$ to about 1E17 cm$^{-3}$. The second segment 214b of the second conductivity region 214 may have a doping concentration ranging from about 1E17 cm$^{-3}$ to about 1E18 cm$^{-3}$, and each second conductivity portion 216, 218, 220 may have a doping concentration ranging from about 5E19 cm$^{-3}$ to about 5E20 cm$^{-3}$. The second conductivity region 214 and the second conductivity portions 216, 218, 220 may have a same conductivity type as the substrate 202, or in other words, may have the first conductivity type. In exemplary non-limiting embodiments where the first conductivity type may be P type, the first segment 214a of the second conductivity region 214 may include a high voltage P type well (HV-PWell); the second segment 214b of the second conductivity region 214 may include a P type well (PWell), and the second conductivity portions 216, 218, 220 may include P+ regions.

The ESD protection device 200 may further include a third conductivity region 222 and a fourth conductivity region 224 arranged at least partially within the second conductivity region 214. The third conductivity region 222 and the fourth conductivity region 224 may include wells and be spaced apart from each other. The second segment 214b of the second conductivity region 214 may be arranged between the third conductivity region 222 and the fourth conductivity region 224. In an exemplary non-limiting embodiment as shown in FIG. 2A, a depth of the second segment 214b of the second conductivity region 214 may be substantially the same as a depth of the third conductivity region 222 and the fourth conductivity region 224. However, the depths of the second segment 214b of the second conductivity region 214, the third conductivity region 222 and the fourth conductivity region 224 may be different in alternative non-limiting embodiments. The ESD protection device 200 may further include a first terminal portion 226 arranged at least partially within the third conductivity region 222, and a second terminal portion 228 arranged at least partially within the fourth conductivity region 224. The first terminal portion 226 and the second terminal portion 228 may be configured for connection to a first external voltage and a second external voltage respectively.

In an exemplary non-limiting embodiment as shown in FIG. 2A, the first and second terminal portions 226, 228 may be arranged immediately below a top surface of the substrate 202, and may each be connected to an external terminal 252, 254 to which the first or second external voltage may be applied. Further, the first and second terminal portions 226, 228, and the third and fourth conductivity regions 222, 224 may be isolated from the substrate 202 via the first and second conductivity regions 208, 214. The third conductivity region 222 and the fourth conductivity region 224 may have approximately equal doping concentrations. Further, the doping concentrations of the third and fourth conductivity regions 222, 224 may be higher than the doping concentration of the first segment 214a of the second conductivity region 214, and the first terminal portion 226 and the second terminal portion 228 may have higher doping concentrations than the third and fourth conductivity regions 222, 224. For example, the third conductivity region 222 may have a doping concentration ranging from about 1E17 $cm^{-3}$ to about 1E19 $cm^{-3}$; the fourth conductivity region 224 may have a doping concentration ranging from about 1E17 $cm^{-3}$ to about 1E19 $cm^{-3}$; the first terminal portion 226 may have a doping concentration ranging from about 5E19 $cm^{-3}$ to about 5E20 $cm^{-3}$, and the second terminal portion 228 may have a doping concentration ranging from about 5E19 $cm^{-3}$ to about 5E20 $cm^{-3}$. The third and fourth conductivity regions 222, 224, and the first and second terminal portions 226, 228 may have a same conductivity type as the first conductivity region 208, in other words, may have the second conductivity type. In exemplary non-limiting embodiments where the second conductivity type may be N type, the third and fourth conductivity regions may be N type wells (Well) and the first and second terminal portions 226, 228 may be N+ regions. In some exemplary non-limiting embodiments, each of the third and fourth conductivity regions 222, 224 may further include a drift region (not shown in the figures) along the boundaries with the second conductivity region 214. The drift regions may help to increase the breakdown voltage of the ESD protection device 200.

In various non-limiting embodiments, the implant material for the first to fourth conductivity regions 208, 214, 222, 224; the terminal portions 204, 206, 226, 228; and the conductivity portions 210, 212, 216, 218, 220 may be the same implant material, for example, an epitaxial silicon material in a non-limiting embodiment. The P type material may be or include, but is not limited to, epitaxial silicon germanium, and/or the N type material may be or include, but is not limited to, doped silicon material including N type dopants. P type dopants can for example, include but are not limited to, boron (B), aluminium (Al), indium (In), or a combination thereof, while N type dopants can include carbon (C), phosphorus (P), arsenic (As), antimony (Sb), or a combination thereof. Other types of implant materials and dopants as known to those skilled in the art may also be useful for forming the first to fourth conductivity regions 208, 214, 222, 224, the terminal portions 204, 206, 226, 228, and the conductivity portions 210, 212, 216, 218, 220.

The ESD protection device 200 may further include a first isolation element 230 and a second isolation element 232. The first and second isolation elements 230, 232 may be configured to isolate the third and fourth conductivity regions 222, 224 from the second conductivity region 214 (e.g. second segment 214b of the second conductivity region 214). In particular, the first isolation element 230 may be arranged between the third conductivity region 222 and the second conductivity region 214 (e.g. the second segment 214b of the second conductivity region 214). The first isolation element 230 may further be arranged between the first terminal portion 226 and the second conductivity portion 218. The second isolation element 232 may be arranged between the fourth conductivity region 224 and the second conductivity region 214 (e.g. the second segment 214b of the second conductivity region 214). The second isolation element 232 may further be arranged between the second terminal portion 228 and the second conductivity portion 218. The ESD protection device 200 may include further isolation elements 234, 236, 238, 240, 242, 244. Each of the isolation elements 234, 244 may be arranged between the substrate 202 and the first conductivity region 208, and between a substrate terminal portion 204/206 and a first conductivity portion 210/212. Each of the isolation elements 236, 242 may be arranged between the first and second conductivity regions 208, 214, and between a first conductivity portion 210/212 and a second conductivity portion 216/220. The isolation element 238 may be arranged between the second conductivity region 214 and the third conductivity region 222, and between the second conductivity portion 216 and the first terminal portion 226. The isolation element 240 may be arranged between the second conductivity region 214 and the fourth conductivity region 224, and between the second conductivity portion 220 and the second terminal portion 228. In various non-limiting embodiments, the isolation elements 230-244 may include an isolation material, such as but not limited to, a gap fill oxide or nitride, or a combination of both. In various non-limiting embodiments, the isolation elements 230-244 may include shallow trench isolation (STI) regions. However, in alternative non-limiting embodiments, one or more of the isolation elements 230-244 may be absent or may include other types of isolation structures as will be elaborated below with reference to FIGS. 10 to 12.

The ESD protection device 200 may also include a silicide blocking layer 246 arranged over a top surface of the substrate 202. As shown in FIG. 2A, the silicide blocking layer 246 may be arranged between the third conductivity region 222 and the fourth conductivity region 224, overlapping at least a part of these conductivity regions 222, 224. In various non-limiting embodiments, the silicide blocking layer 246 may block silicide processing on (or in other words, block silicide, that may be deposited during fabrication of the ESD protection device 200, from interacting with) the first terminal portion 226, the second terminal portion 228 and the second conductivity portion 218. The silicide blocking layer 246 may be formed of any silicide blocking material known to those skilled in the art, such as, but not limited to, nitride.

When the ESD protection device 200 is in use, the ESD protection device 200 may be further configured to connect to an apparatus (not shown in FIG. 2A), such as, but not limited to a consumer electronic product, that is to be protected by the ESD protection device 200. The apparatus may be configured to connect to the first terminal portion 226 and the second terminal portion 228, for example, via the terminals 252, 254. The first conductivity region 208 and the second conductivity region 214 may be set to float. In various non-limiting embodiments, the substrate terminal portions 204, 206 may be connected to ground (GND) via the terminals 250, 256. One of the terminal portions 226/228 may be connected to a general power supply voltage pad ($V_{DD}$) of the apparatus and the other terminal portion 226/228 may be connected to a ground pad (GND) of the apparatus. In other words, the first and second external voltages may be $V_{DD}$ or ground (GND). However, in alternative non-limiting embodiments, the substrate terminal portions 204, 206, and the first and second terminal portions 226, 228 may be connected to other voltages.

To protect the apparatus from damage due to overly high ESD voltages between the terminals 252, 254, the ESD protection device 200 may be configured such that when a difference between the first external voltage and the second external voltage exceeds a predetermined threshold, a first discharge current may pass through the second conductivity region 214 between the third conductivity region 222 and the fourth conductivity region 224. The first discharge current may cause a second discharge current to pass through the second conductivity region 214 between the first conductivity region 208 and the third conductivity region 222, or through the second conductivity region 214 between the first conductivity region 208 and the fourth conductivity region 224.

To elaborate, in an exemplary non-limiting embodiment as shown in FIG. 2A, when the first external voltage is higher than the second external voltage, the p-n junction 260 between the second conductivity region 214, and the third conductivity region 222 may be reverse biased. Accordingly, when a difference between the first external voltage and the second external voltage exceeds a first predetermined threshold, the p-n junction 260 may break down, and a first npn transistor may turn on, which may include the third conductivity region 222 as the collector, the second conductivity region 214 (e.g. the second segment 214b of the second conductivity region 214) as the base and the fourth conductivity region 224 as the emitter. A first discharge current may then pass from the emitter through the base to the collector of the first npn transistor. In other words, the first discharge current may pass through the second conductivity region 214 between the third conductivity region 222 and the fourth conductivity region 224. The first discharge current may then turn on a second npn transistor which may include the fourth conductivity region 224 as the emitter, the second conductivity region 214 (e.g. the first segment 214a of the second conductivity region 214) as the base, and the first conductivity region 208 as the collector. A second discharge current may then pass from the emitter through the base to the collector of this second npn transistor. In other words, the first discharge current may cause the second discharge current to pass through the second conductivity region 214 between the first conductivity region 208 and the fourth conductivity region 224.

In the exemplary non-limiting embodiment as shown in FIG. 2A, when the second external voltage is higher than the first external voltage, the p-n junction 262, between the second conductivity region 214 and the fourth conductivity region 224, may also be reverse biased. Accordingly, when a difference between the first external voltage and the second external voltage exceeds the first predetermined threshold, the p-n junction 262 may break down and a first npn transistor may turn on, which may include the fourth conductivity region 224 as the collector, the second conductivity region 214 (e.g. the second segment 214b of the second conductivity region 214) as the base and the third conductivity region 222 as the emitter. A first discharge current may then pass from the emitter through the base to the collector of the first npn transistor. In other words, the first discharge current may pass through the second conductivity region 214 between the third conductivity region 222 and the fourth conductivity region 224. The first discharge current may then turn on a second npn transistor which may include the third conductivity region 222 as the emitter, the second conductivity region 214 (e.g. the first segment 214a of the second conductivity region 214) as the base and the first conductivity region 208 as the collector. A second discharge current may then pass from the emitter through the base to the collector of this second npn transistor. In other words, the first discharge current may cause the second discharge current to pass through the second conductivity region 214 between the first conductivity region 208 and the third conductivity region 222.

Accordingly, as shown in FIG. 2B, in various non-limiting embodiments, an equivalent circuit of the ESD protection device 200 may include a transistor having the third conductivity region 222 as the emitter (when the second external voltage is higher than the first external voltage) and the fourth conductivity region 224 as the emitter (when the first external voltage is higher than the second external voltage). The second conductivity region 214 may act as the base regardless of the direction of the current flow through the ESD protection device. It is understood that the direction of the currents described above may be reversed if the conductivity types in the depicted embodiment of FIG. 2A are reversed.

Providing the first and second conductivity regions 208, 214 and setting these regions 208, 214 to float may allow the first conductivity region 208 to act as a collector of the second npn transistor and the second conductivity region 214 to act as a base of the first and second npn transistors, regardless of the polarity of the voltage between the first and second terminal portions 226, 228 (in other words, regardless which of the first and second external voltages is higher). Therefore, the ESD protection device 200 may be capable of supporting bi-directional high voltage bias and providing bi-directional ESD current conduction. In various non-limiting embodiments where the first external voltage may be higher than the second external voltage, the first external voltage may be a general power supply voltage $V_{DD}$ and the second external voltage may be ground, or the first external voltage may be positive and the second external voltage may be negative. In alternative non-limiting embodiments where the first external voltage may be lower than the second external voltage, the second external voltage may be a general power supply voltage $V_{DD}$, and the first external voltage may be ground. Or the first external voltage may be negative, and the second external voltage may be positive.

Further, both the first discharge currents and the second discharge currents through the ESD protection device 200 as described above may help to conduct current away from the apparatus in various non-limiting embodiments. This may allow the ESD protection device 200 to have improved ESD current conduction capability.

Figure 3:
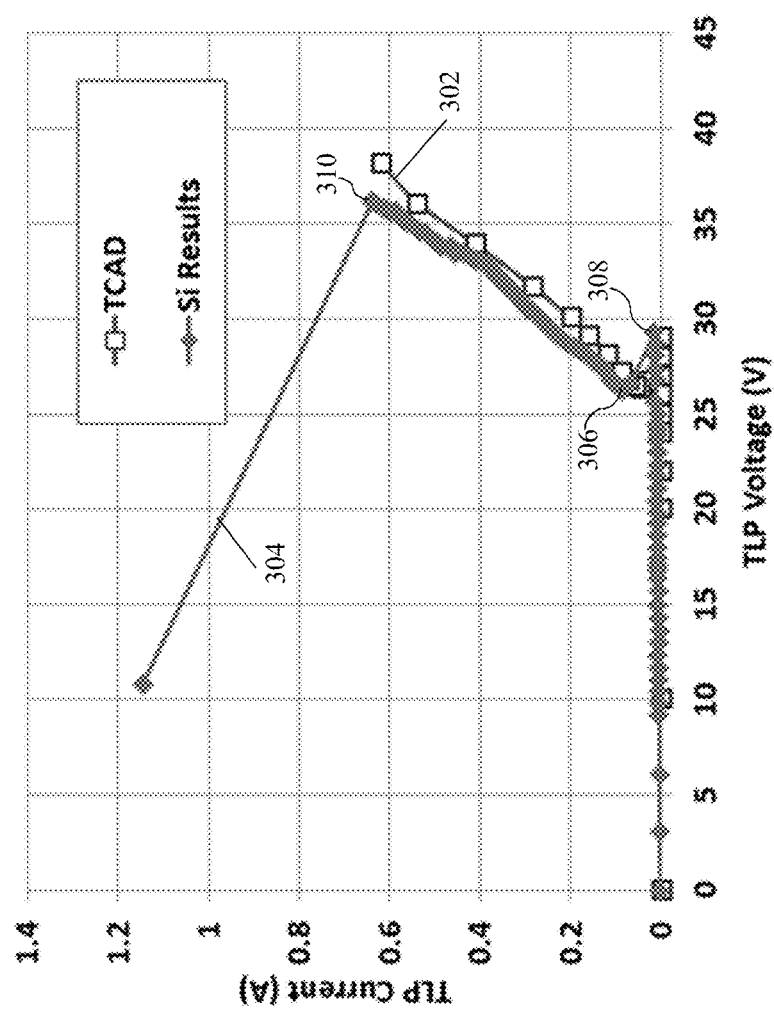
FIG. 3 shows graphs of the performance of the ESD protection device of FIG. 2A obtained from simulating the device using technology computer aided design (TCAD) and from silicon results.

In various non-limiting embodiments, the ESD protection device 200 may be compact, and may have good clamping ability and a high holding voltage to provide latch-up immunity. FIG. 3 illustrates the performance of the ESD protection device 200 when a width of the ESD protection device 200 is set as 100 um and when the first external voltage is greater than the second external voltage. However, due to the symmetry of the structure of the ESD protection device 200, the results obtained when the second external voltage is greater than the first external voltage may be substantially the same as those shown in FIG. 3. In particular, each graph 302, 304 is a plot of transmission line pulse (TLP) current against transmission line pulse (TLP) voltage. The graph 302 shows results obtained from simulating the device 200 with technology computer aided design (TCAD); whereas, the graph 304 shows silicon results (Si Results). As shown in FIG. 3, the graphs 302 and 304 closely resemble each other. Referring to the graphs 302, 304, the results indicate that the device 200 may have a holding voltage (Vh) of about 26.5V (at 306), a triggering voltage (Vt1) of about 29.3V (at 308), a second breakdown voltage (Vt2) of about 36V (at 310), and a second breakdown current (It2) of about 0.64 A (at 310).

Figure 4:
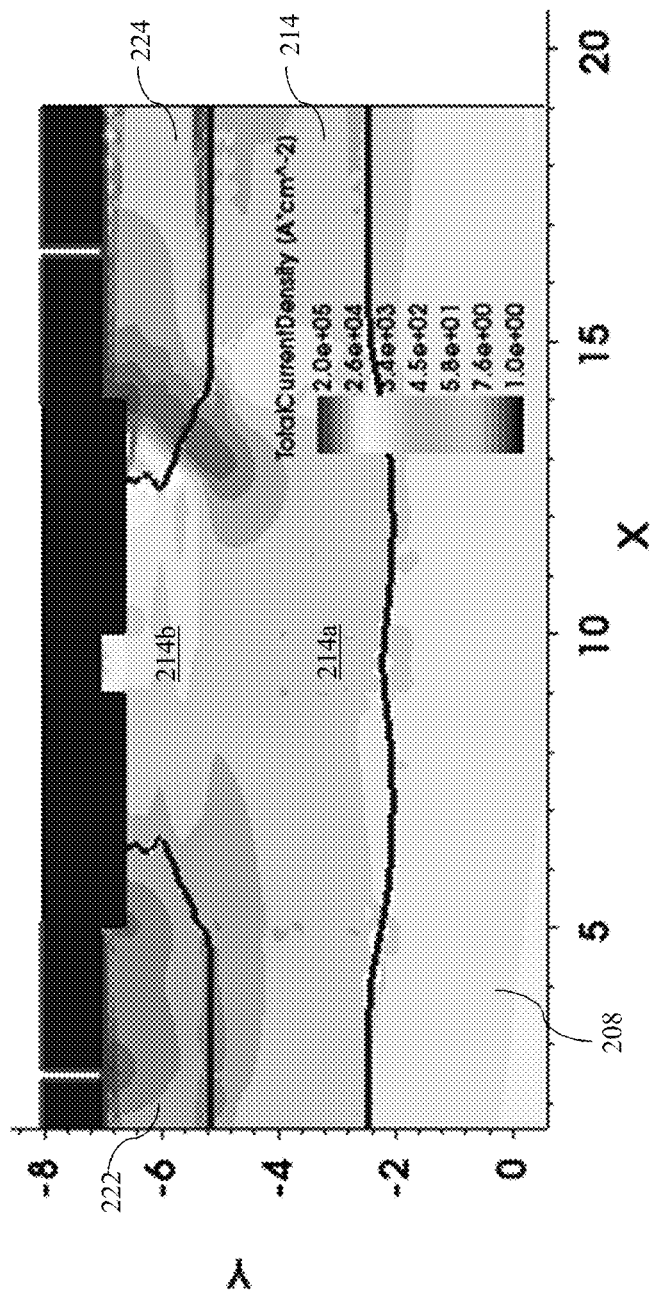
FIG. 4 shows a current density graph of a portion of the ESD protection device of FIG. 2A obtained from simulating the device using TCAD.

FIG. 4 shows a current density graph of a portion of the ESD protection device 200 obtained from simulating the ESD protection device 200 using TCAD. As shown in FIG. 4, a higher current density flows through the third and fourth conductivity regions 222, 224 as compared to through the first conductivity region 208. In other words, the current density graph indicates that the first discharge current may be higher than the second discharge current.

Figure 5:
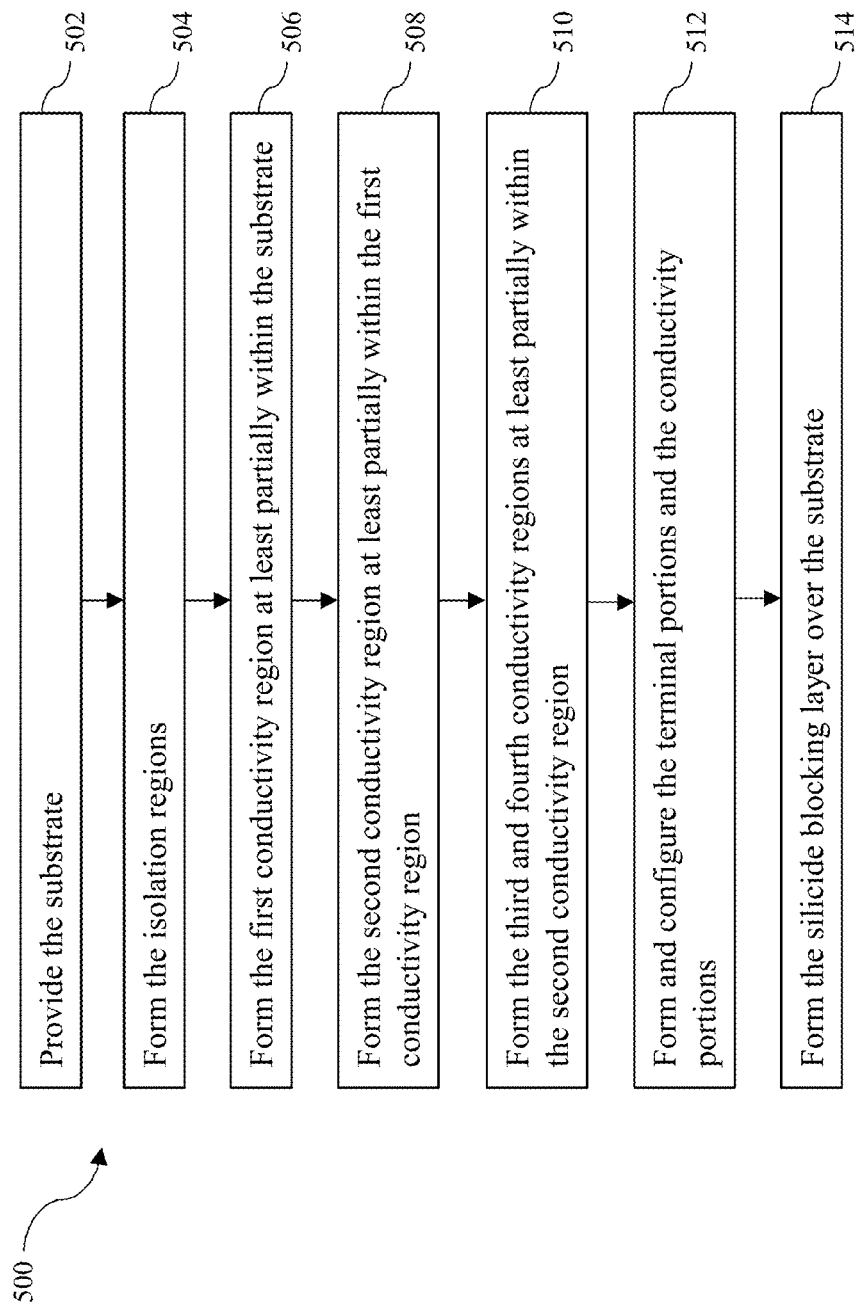
FIG. 5 shows a flow chart of a method for forming the ESD protection device of FIG. 2A.

FIG. 5 shows a flow chart of a method 500 for forming the ESD protection device 200 according to various non-limiting embodiments. As shown in FIG. 5, the method 500 may begin (at 502) by providing the substrate 202. The method 500 may then include forming (at 504) the isolation elements (including the first isolation element 230, the second isolation element 232, and the other isolation elements 234-244). In various non-limiting embodiments, the isolation elements 230-244 may be formed by any method as known to those skilled in the art. For instance, a mask may be arranged over the substrate 202 to expose portions of the substrate 202 intended for the isolation elements 230-244, the exposed portions may then be etched to form trenches, and the trenches may be filled with isolation material.

The method 500 may include forming (at 506) the first conductivity region 208 at least partially within the substrate 202. The method 500 may include forming (at 508) the second conductivity region 214 at least partially within the first conductivity region 208. The method 500 may include forming (at 510) the third conductivity region 222 and the fourth conductivity region 224 at least partially within the second conductivity region 214. The first, second, third and fourth conductivity regions 208, 214, 222, 224 may be formed using any method as known to those skilled in the art. In a non-limiting example, each conductivity region 208, 214, 222, 224 may be formed by using a mask to expose a portion of the substrate 202 intended for the conductivity region 208, 214, 222, 224 and doping the exposed portion with the appropriate dopants (e.g. either P type or N type dopants). In exemplary non-limiting embodiments where the second conductivity region 214 may include the first segment 214a and the second segment 214b, the portions of the substrate 202 intended for the first and second segments 214a, 214b may be separately doped, with the first segment 214a doped with a lower number of dopants per unit volume than the second segment 214b.

Next, the method 500 may include forming and configuring (at 512) the terminal portions 204, 206, 226, 228 and the conductivity portions 210, 212, 216, 218, 220. For example, at 512, the method 500 may include forming the first terminal portion 226 at least partially within the third conductivity region 222, and the second terminal portion 228 at least partially within the fourth conductivity region 224, and configuring the first terminal portion 226 and the second terminal portion 228 for connection to the first external voltage and the second external voltage respectively. In various non-limiting embodiments, the terminal portions 204, 206, 226, 228 and the conductivity portions 210, 212, 216, 218, 220 may be formed by injecting dopants into the respective portions of the substrate 202. The injection of the dopants may be performed by any method known to those skilled in the art, such as, but not limited to ion injection.

The method may further include forming (at 514) the silicide blocking layer 246 over the substrate 202 using any method as known to those skilled in the art. For instance, in a non-limiting example, the silicide blocking layer 246 may be formed by depositing a silicide blocking material over a top surface of the substrate 202, and etching the silicide blocking material.

Figure 6:
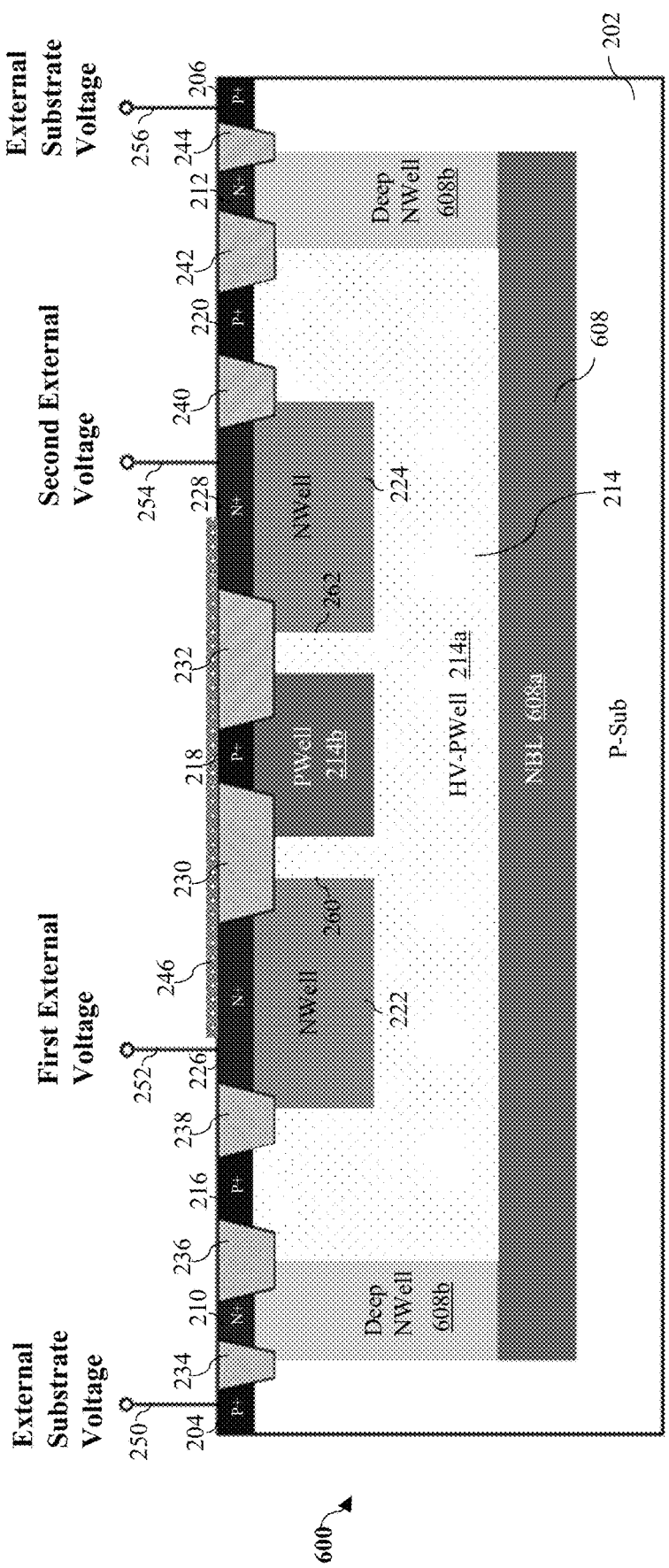
FIG. 6 shows a simplified cross-sectional view of an ESD protection device according to alternative non-limiting embodiments.

FIG. 6 shows a simplified cross-sectional view of an ESD protection device 600 according to alternative non-limiting embodiments. The ESD protection device 600 is similar to the ESD protection device 200 and hence, the common features are labelled with the same reference numerals and need not be discussed.

As shown in FIG. 6, the ESD protection device 600 may also include a first conductivity region 608 similar to the first conductivity region 208 of the ESD protection device 200, except that the first conductivity region 608 of the ESD protection device 600 may include a buried layer 608a arranged between the second conductivity region 214 and the substrate 202. In the ESD protection device 600, the first conductivity region 608 may also include two deep wells 608b arranged over the buried layer 608a, where these deep wells 608b may be arranged between the substrate 202 and the second conductivity region 214. The deep wells 608b may be substantially similar to the deep well 208 in the ESD protection device 200. In exemplary non-limiting embodiments where the first conductivity type may be P type and the second conductivity type may be N type, the buried layer 608a may be an N type buried layer (NBL), and the deep wells 608b may be deep N type wells (Deep NWell). In various non-limiting embodiments, the doping concentration of the buried layer 608a may be higher than the doping concentrations of the deep wells 608b. For example, the doping concentration of the buried layer 608a may range from about 1E18 $cm^{-3}$ to about 1E20 $cm^{-3}$, and the doping concentration of each deep well 608b may range from about 5E15 $cm^{-3}$ to about 5E16 $cm^{-3}$.

Figure 7:
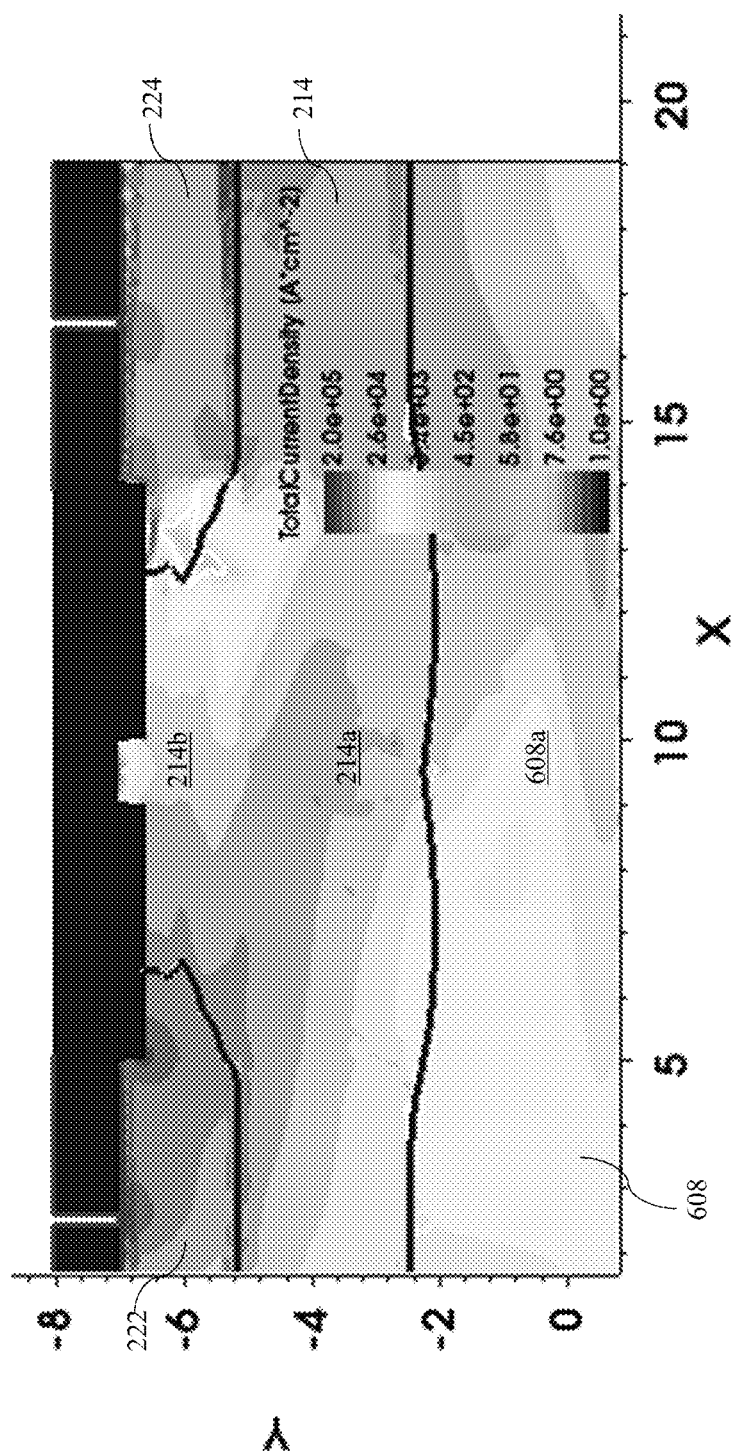
FIG. 7 shows a current density graph of a portion of the ESD protection device of FIG. 6 obtained from simulating the device using TCAD.

FIG. 7 shows a current density graph of a portion of the ESD protection device 600 obtained from simulating the ESD protection device 600 using TCAD. As shown in FIG. 7, by including a buried layer 608a in the first conductivity region 608, more current may flow through the first conductivity region 608 (particularly, through the buried layer 608a). In other words, the second discharge current may become higher. Thus, as compared to the first conductivity region 208 of the ESD protection device 200, the first conductivity region 608 of the ESD protection device 600 may be a more active collector capable of conducting a greater amount of current. Accordingly, the current conduction capability of the ESD protection device 600 may be higher than that of the ESD protection device 200.

Figure 8A:
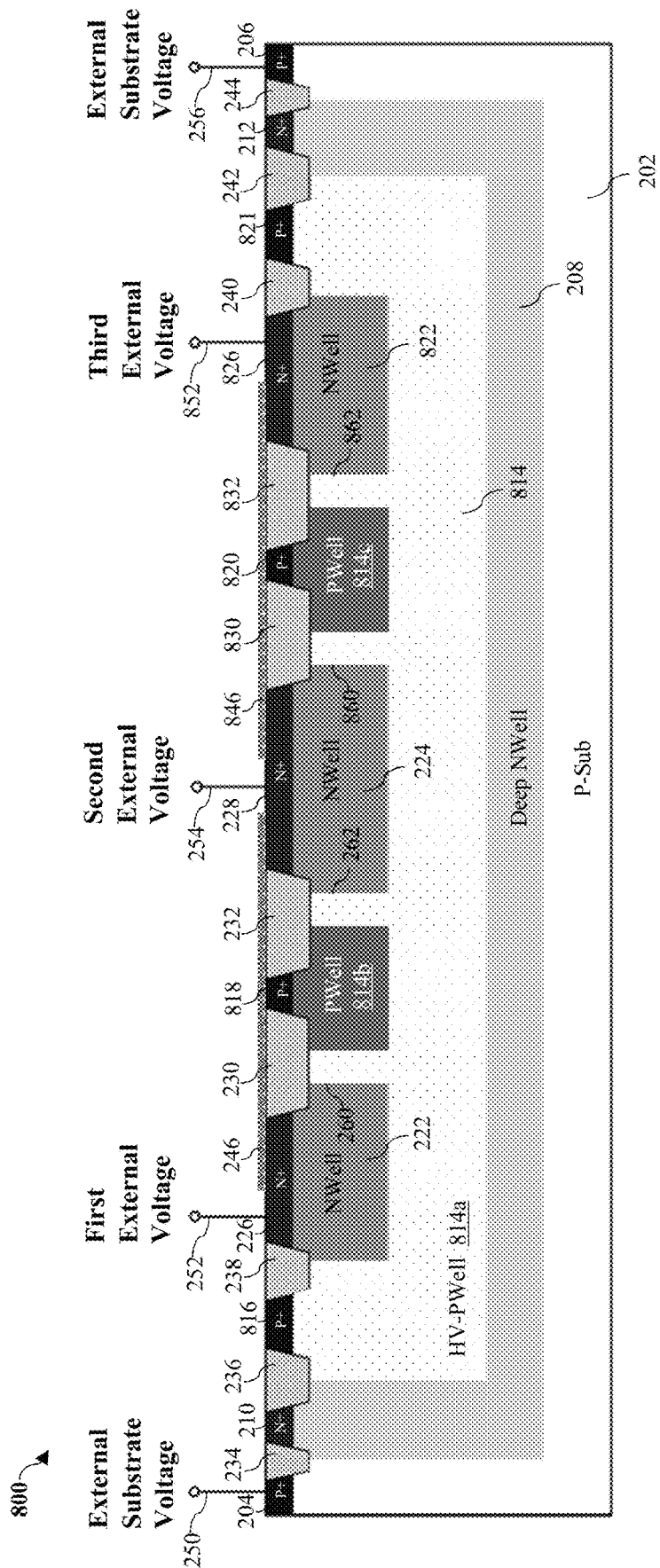
FIG. 8A shows a simplified cross-sectional view of an ESD protection device according to alternative non-limiting embodiments.

FIG. 8A shows a simplified cross-sectional view of an ESD protection device 800 according to alternative non-limiting embodiments. The ESD protection device 800 is similar to the ESD protection device 200 and hence, the common features are labelled with the same reference numerals and need not be discussed. In various non-limiting embodiments, the ESD protection device 800 may be referred to as a 3-port ESD protection device.

As shown in FIG. 8A, as compared to the ESD protection device 200, the ESD protection device 800 may further include a fifth conductivity region 822 arranged at least partially within the second conductivity region 814 (that may be substantially similar to the second conductivity region 214 of the ESD protection device 200). In various non-limiting embodiments, the fifth conductivity region 822 may be similar to the third and fourth conductivity regions 222, 226 and may also have the second conductivity type. In exemplary non-limiting embodiments where the second conductivity type may be N type, the fifth conductivity region 822 may include an N type well (NWell). In addition, the ESD protection device 800 may further include a third terminal portion 826 arranged at least partially within the fifth conductivity region 822, where the third terminal portion 826 may be configured for connection to a third external voltage. In an exemplary non-limiting embodiment as shown in FIG. 8A, the third terminal portion 826 may (similar to the first and second terminal portions 226, 228) be arranged immediately below a top surface of the substrate 202 and may be connected to an external terminal 852 to which the third external voltage may be applied.

Further, the second conductivity region 814 of the ESD protection device 800 may include first and second segments 814a, 814b similar to those of the second conductivity region 214 of the ESD protection device 200. However, the second conductivity region 814 of the ESD protection device 800 may further include a third segment 814c. The second segment 814b may be arranged between the third conductivity region 222 and the fourth conductivity region 224, and the third segment 814c may be arranged between the fourth conductivity region 224 and the fifth conductivity region 822. Second conductivity portions 816, 818, 820, 821 similar to the second conductivity portions 216, 218, 220 of the ESD protection device 200 may be arranged at least partially within the second conductivity region 814 of the ESD protection device 800. For example, the second conductivity portions 816, 821 may be arranged at least partially in the first segment 814a of the second conductivity region 814, and the second conductivity portions 818, 820 may be arranged at least partially in the second segment 814b and the third segment 814c of the second conductivity region 814, respectively. In various non-limiting embodiments, the second segment 814b and the third segment 814c of the second conductivity region 814 may have higher doping concentrations than the first segment 814a. In some exemplary non-limiting embodiments, the depths of the first to third segments 814a-814c of the second conductivity region 814 may be substantially the same as the depths of the third to fifth conductivity regions 222, 224, 822. However, these depths may be different in alternative non-limiting embodiments.

The ESD protection device 800 may include isolation elements 230-244 similar to those of the ESD protection device 200. The ESD protection device 800 may further include a first further isolation element 830 and a second further isolation element 832. The first further isolation element 830 may be arranged between the fourth conductivity region 224 and the second conductivity region 814 (e.g. the third segment 814c of the second conductivity region 814) and between the second terminal portion 228 and the second conductivity portion 820. The second further isolation element 832 may be arranged between the fifth conductivity region 822 and the second conductivity region 814 (e.g. the third segment 814c of the second conductivity region 814) and between the third terminal portion 826 and the second conductivity portion 820. Accordingly, the terminal portions 226, 228, 826 may be isolated from one another.

The ESD protection device 800 may also include a silicide blocking layer 246 similar to that of the ESD protection device 200, and a first further silicide blocking layer 846 arranged over the substrate 202. In the exemplary non-limiting embodiment as shown in FIG. 8A, the first further silicide blocking layer 846 may be arranged between the fourth conductivity region 224 and the fifth conductivity region 822, overlapping at least a part of the fourth and fifth conductivity regions 224, 822.

Figure 8B:
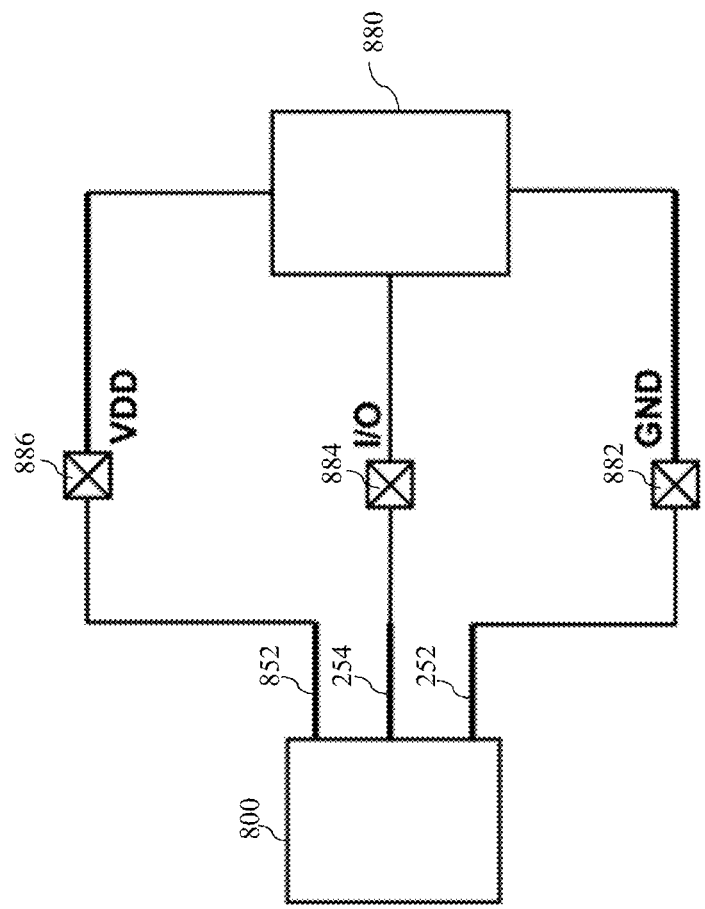
FIG. 8B shows a schematic diagram of the ESD protection device of FIG. 8A configured to connect to an apparatus that is to be protected by the ESD protection device.

FIG. 8B shows a schematic diagram of the ESD protection device 800 configured to connect to an apparatus 880 that is to be protected by the ESD protection device 800 (or in other words, that may have internal circuits to be protected by the ESD protection device 800). Referring to FIG. 8B, the first terminal portion 226 of the ESD protection device 800 may be connected to a ground pad (GND) 882 of the apparatus 880 via the terminal 252, the second terminal portion 228 of the ESD protection device 800 may be connected to an input/output (I/O) pad 884 of the apparatus 880 via the terminal 254, and the third terminal portion 826 of the ESD protection device 800 may be connected to a general power supply voltage (VDD) pad 886 of the apparatus 880 via the terminal 852. Although not shown in the figures, the substrate terminal portions 204, 206 may be connected to ground when the ESD protection device 800 is in use in various non-limiting embodiments.

In various non-limiting embodiments, when a difference between the first external voltage and the second external voltage exceeds a first predetermined threshold, a first discharge current and a second discharge current may pass through the ESD protection device 800 in a similar manner as that described above with reference to the ESD protection device 200. When a difference between the second external voltage and the third external voltage exceeds a second predetermined threshold, a first discharge current and a second discharge current may also pass through the ESD protection device 800 in a similar manner. The second predetermined threshold may be the same as the first predetermined threshold in some non-limiting examples but may be different from the first predetermined threshold in alternative non-limiting examples.

In exemplary non-limiting embodiments, when the second external voltage is higher than the third external voltage, and a difference between the second external voltage and the third external voltage exceeds the second predetermined threshold, the p-n junction 860 between the fourth conductivity region 224 and the second conductivity region 814 may break down. This may turn on a first npn transistor, which may include the fourth conductivity region 224 as the collector, the second conductivity region 814 (e.g. the third segment 814c of the second conductivity region 814) as the base, and the fifth conductivity region 822 as the emitter. A first discharge current may then pass from the emitter through the base to the collector of the first npn transistor. In other words, the first discharge current may pass through the second conductivity region 814 between the fourth conductivity region 224 and the fifth conductivity region 822. The first discharge current may then turn on a second npn transistor which may include the fifth conductivity region 822 as the emitter, the second conductivity region 814 (e.g. the first segment 814a of the second conductivity region 814) as the base and the first conductivity region 208 as the collector. A second discharge current may then pass from the emitter through the base to the collector of this second npn transistor. In other words, the first discharge current may cause a second discharge current to pass through the second conductivity region 814 between the first conductivity region 208 and the fifth conductivity region 822.

In exemplary non-limiting embodiments, when the third external voltage is higher than the second external voltage, and when a difference between the second external voltage and the third external voltage exceeds the second predetermined threshold, the p-n junction 862 between the fifth conductivity region 822 and the second conductivity region 814 may break down. This may turn on a first npn transistor which may include the fifth conductivity region 822 as the collector, the second conductivity region 814 (e.g. the third segment 814c of the second conductivity region 814) as the base and the fourth conductivity region 224 as the emitter. A first discharge current may then pass from the emitter through the base to the collector of the first npn transistor. In other words, the first discharge current may pass through the second conductivity region 814 between the fourth conductivity region 224 and the fifth conductivity region 822. The first discharge current may then turn on a second npn transistor which may include the fourth conductivity region 224 as the emitter, the second conductivity region 814 (e.g. the first segment 814a of the second conductivity region 814) as the base and the first conductivity region 208 as the collector. A second discharge current may then pass from the emitter through the base to the collector of the second npn transistor. In other words, the first discharge current may cause a second discharge current to pass through the second conductivity region 814 between the first conductivity region 208 and the fourth conductivity region 224.

Similar to the ESD protection device 200, the ESD protection device 800 may be a compact device with a high holding voltage (in other words, with latch-up immunity) and good clamping ability. Further, with three terminal portions 226, 228, 826, the ESD protection device 800 may support dual polarity high voltage bias for both the VDD to I/O path and the I/O to GND path within a single structure in various non-limiting embodiments.

Figure 9:
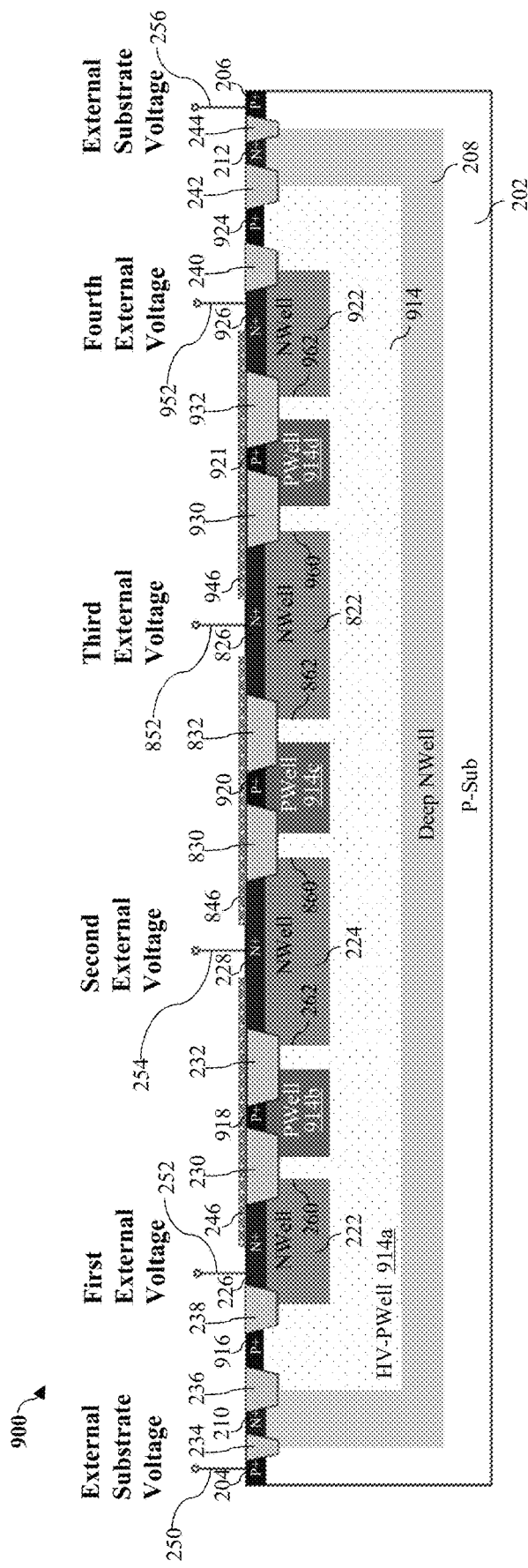
FIG. 9 shows a simplified cross-sectional view of an ESD protection device according to alternative non-limiting embodiments.

FIG. 9 shows a simplified cross-sectional view of an ESD protection device 900 according to alternative non-limiting embodiments. The ESD protection device 900 is similar to the ESD protection device 800 and hence, the common features are labelled with the same reference numerals and need not be discussed.

As shown in FIG. 9, as compared to the ESD protection device 800, the ESD protection device 900 may further include a sixth conductivity region 922 arranged at least partially within the second conductivity region 914 (that may be substantially similar to the second conductivity region 814 of the memory device 800). In various non-limiting embodiments, the sixth conductivity region 922 may be similar to the third, fourth and fifth conductivity regions 222, 224, 822 and may have the second conductivity type. In exemplary non-limiting embodiments where the second conductivity type may be N type, the sixth conductivity region 922 may include an N type well (Well). Further, the ESD protection device 900 may also include a fourth terminal portion 926 arranged at least partially within the sixth conductivity region 922, where the fourth terminal portion 926 may be configured for connection to a fourth external voltage. In an exemplary non-limiting embodiment as shown in FIG. 9, the fourth terminal portion 926 may (similar to the first, second and third terminal portions 226, 228, 826) be arranged immediately below a top surface of the substrate 202 and may be connected to an external terminal 952 to which the fourth external voltage may be applied.

Further, the second conductivity region 914 of the ESD protection device 900 may include a first segment 914a, a second segment 914b and a third segment 914c similar to those of the second conductivity region 814 of the ESD protection device 800. However, the second conductivity region 914 may further include a fourth segment 914d. The second segment 914b may be arranged between the third conductivity region 222 and the fourth conductivity region 224; the third segment 914c may be arranged between the fourth conductivity region 224 and the fifth conductivity region 822; and the fourth segment 914d may be arranged between the fifth conductivity region 822 and the sixth conductivity region 922. Second conductivity portions 916, 918, 920, 921, 924 similar to the second conductivity portions 816, 818, 820, 821 of the ESD protection device 800 may be arranged at least partially within the second conductivity region 914 of the ESD protection device 900. For example, the second conductivity portions 916, 924 may be arranged at least partially in the first segment 914a of the second conductivity region 914 and the second conductivity portions 918, 920, 921 may be arranged at least partially in the second segment 914b, third segment 914c and fourth segment 914d of the second conductivity region 914, respectively. In various non-limiting embodiments, the second segment 914b, the third segment 914c, and the fourth segment 914d of the second conductivity region 914 may have higher doping concentrations than the first segment 914a. In some exemplary non-limiting embodiments, the depths of the first to fourth segments 914a-914d of the second conductivity region 914 may be substantially the same as the depths of the third to sixth conductivity regions 222, 224, 822, 922. However, these depths may be different in alternative non-limiting embodiments.

Similar to the ESD protection device 800, the ESD protection device 900 may include a first further isolation element 830 and a second further isolation element 832. The ESD protection device 900 may additionally include a third further isolation element 930 and a fourth further isolation element 932. The third further isolation element 930 may be arranged between the fifth conductivity region 822 and the second conductivity region 914 (e.g. the fourth segment 914d of the second conductivity region 914) and between the third terminal portion 826 and the second conductivity portion 921. The fourth further isolation element 932 may be arranged between the sixth conductivity region 922 and the second conductivity region 914 (e.g. the fourth segment 914d of the second conductivity region 914) and between the fourth terminal portion 926 and the second conductivity portion 921. Accordingly, the terminal portions 226, 228, 826, 926 may be isolated from one another.

The ESD protection device 900 may include a silicide blocking layer 246 and a first further silicide blocking layer 846 (similar to the ESD protection device 800). The ESD protection device 900 may additionally include a second further silicide blocking layer 946 arranged over the substrate 202. In the exemplary non-limiting embodiment as shown in FIG. 9, the second further silicide blocking layer 946 may be arranged between the fifth conductivity region 822 and the sixth conductivity region 922, overlapping at least a part of the fifth and sixth conductivity regions 822, 922.

When the ESD protection device 900 is in use with an apparatus that is to be protected by the ESD protection device 900, the first terminal portion 226 of the ESD protection device 900 and the fourth terminal portion 926 of the ESD protection device 900 may be connected to a same voltage pad of the apparatus in various non-limiting embodiments. Further, in various non-limiting embodiments, one of the terminal portions 226, 228, 826, 926 of the ESD protection device 900 may be connected to a general power supply voltage (VDD) pad of the apparatus and one of the terminal portions 226, 228, 826, 926 of the ESD protection device 900 may be connected to a ground (GND) pad of the apparatus, and only the second conductivity region 914 may be arranged between the terminal portion 226, 228, 826, 926 connected to the general power supply voltage (VDD) pad and the terminal portion 226, 228, 826, 926 connected to the ground (GND) pad. Although not shown in the figures, in various non-limiting embodiments, the substrate terminal portions 204, 206 may be connected to ground when the ESD protection device 900 is in use.

Table 1 shows how the ESD protection device 900 may be connected to the apparatus in different exemplary non-limiting embodiments. As shown in Table 1, in a first exemplary non-limiting embodiment, the first terminal portion 226 and the fourth terminal portion 926 may be connected to a general power supply voltage (VDD) pad, the second terminal portion 228 may be connected to a ground (GND) pad, and the third terminal portion 826 may be connected to an input/output (I/O) pad. In a second exemplary non-limiting embodiment, the first terminal portion 226 and the fourth terminal portion 926 may be connected to a ground (GND) pad, the second terminal portion 228 may be connected to a general power supply voltage (VDD) pad, and the third terminal portion 826 may be connected to an input/output (I/O) pad. In a third exemplary non-limiting embodiment, the first terminal portion 226 and the fourth terminal portion 926 may be connected to an input/output (I/O) pad, the second terminal portion 228 may be connected to a general power supply voltage (VDD) pad, and the third terminal portion 826 may be connected to a ground (GND) pad.

TABLE 1

|  | First terminal portion 226 | Second terminal portion 228 | Third terminal portion 826 | Fourth terminal portion 926 |
| --- | --- | --- | --- | --- |
| First exemplary non-limiting embodiment | VDD pad | GND pad | I/O pad | VDD pad |
| Second exemplary non-limiting embodiment | GND pad | VDD pad | I/O pad | GND pad |
| Third exemplary non-limiting embodiment | I/O pad | VDD pad | GND pad | I/O pad |

In various non-limiting embodiments, when a difference between the first external voltage and the second external voltage exceeds a first predetermined threshold, a first discharge current and a second discharge current may pass through the ESD protection device 900 in a similar manner as that described above for the ESD protection devices 200, 800. When a difference between second external voltage and the third external voltage exceeds a second predetermined threshold, a first discharge current and a second discharge current may pass through the ESD protection device 900 in a similar manner as that described above for the ESD protection device 800. When a difference between the third external voltage and the fourth external voltage exceeds a third predetermined threshold, a first discharge current and a second discharge current may also pass through the ESD protection device 900 in a similar manner. The first, second and third predetermined thresholds may be the same in some non-limiting examples but may be different in alternative non-limiting examples.

In exemplary non-limiting embodiments, when the third external voltage is higher than the fourth external voltage and a difference between the third external voltage and the fourth external voltage exceeds the third predetermined threshold, the p-n junction 960 between the fifth conductivity region 822 and the second conductivity region 914 may break down. This may turn on a first npn transistor that may include the fifth conductivity region 822 as the collector, the second conductivity region 914 (e.g. the fourth segment 914d of the second conductivity region 914) as the base, and the sixth conductivity region 922 as the emitter. A first discharge current may then pass from the emitter through the base to the collector of the first npn transistor. In other words, the first discharge current may pass through the second conductivity region 914 between the fifth conductivity region 822 and the sixth conductivity region 922. The first discharge current may then turn on a second npn transistor which may include the sixth conductivity region 922 as the emitter, the second conductivity region 914 (e.g. the first segment 914a of the second conductivity region 914) as the base and the first conductivity region 208 as the collector. A second discharge current may then pass from the emitter through the base to the collector of this second npn transistor. In other words, the first discharge current may cause a second discharge current to pass through the second conductivity region 914 between the first conductivity region 208 and the sixth conductivity region 922.

In exemplary non-limiting embodiments, when the fourth external voltage is higher than the third external voltage and when a difference between the third external voltage and the fourth external voltage exceeds the third predetermined threshold, the p-n junction 962 between the sixth conductivity region 922 and the second conductivity region 914 may break down. This may turn on a first npn transistor that may include the sixth conductivity region 922 as the collector, the second conductivity region 914 (e.g. the fourth segment 914d of the second conductivity region 914) as the base, and the fifth conductivity region 822 as the emitter. A first discharge current may then pass from the emitter through the base to the collector of the first npn transistor. In other words, the first discharge current may pass through the second conductivity region 914 between the fifth conductivity region 822 and the sixth conductivity region 922. The first discharge current may then turn on a second npn transistor which may include the fifth conductivity region 822 as the emitter, the second conductivity region 914 (e.g. the first segment 914a of the second conductivity region 914) as the base, and the first conductivity region 208 as the collector. A second discharge current may then pass from the emitter through the base to the collector of the second npn transistor. In other words, the first discharge current may cause a second discharge current to pass through the second conductivity region 914 between the first conductivity region 208 and the fifth conductivity region 822.

Similar to the ESD protection devices 200, 800, the ESD protection device 900 may be a compact device with good clamping ability and a high holding voltage to provide latch-up immunity. In various non-limiting embodiments, with the additional fourth terminal portion 926, the clamping ability of the ESD protection device 900 from the general power supply voltage (VDD) to ground may be better than that of the ESD protection device 800. Said differently, the current path between the VDD and ground may be shorter in the ESD protection device 900 and thus, the on resistance of the ESD protection device 900 may be lower than the on resistance of the ESD protection device 800.

As depicted in the figures described above, each memory device 200, 600, 800, 900 may include a plurality of isolation elements 230-244, 830, 832, 930, 932 which may include shallow trench isolation (STI) regions. However, in alternative non-limiting embodiments, one or more of the isolation elements 230-244, 830, 832, 930, 932 may be absent or may include other types of isolation structures.

Figure 10:
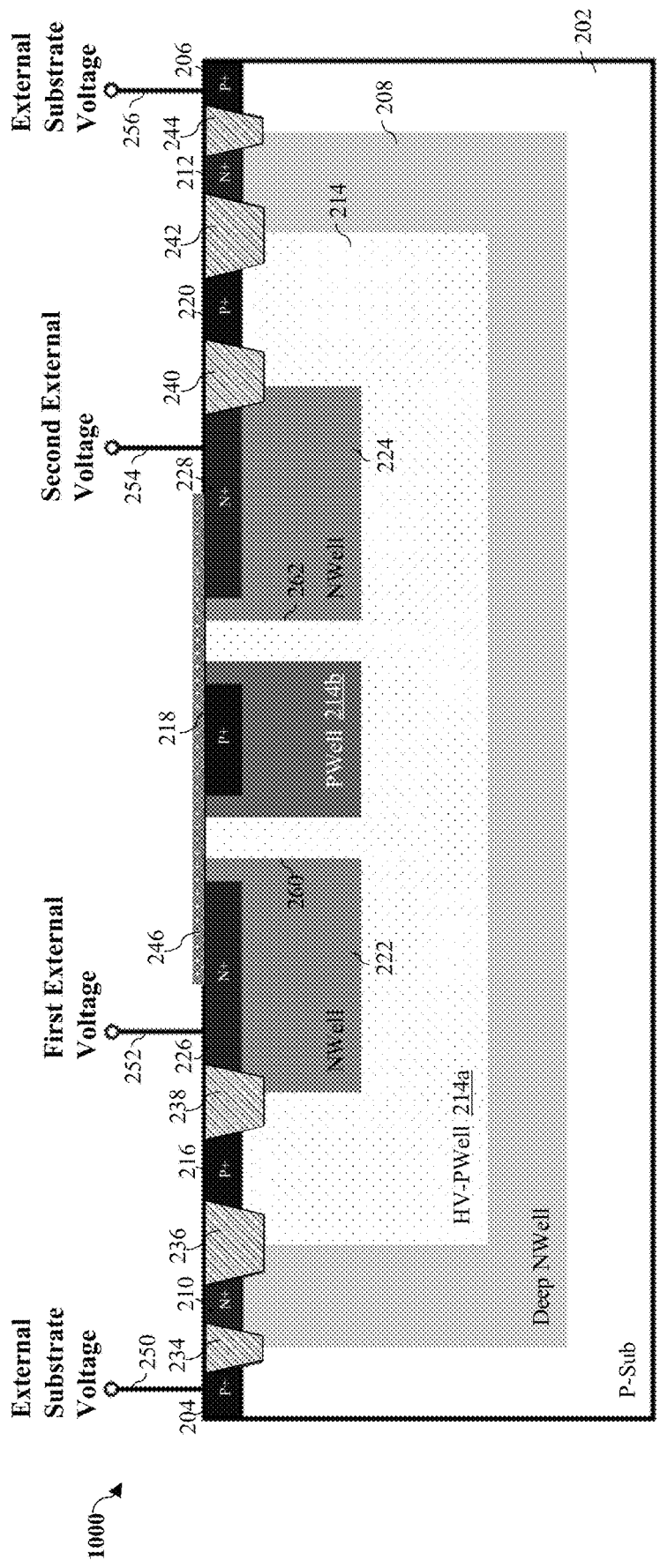
FIG. 10 shows a simplified cross-sectional view of an ESD protection device according to alternative non-limiting embodiments.

For example, FIG. 10 shows a simplified cross-sectional view of an ESD protection device 1000 according to alternative non-limiting embodiments. The ESD protection device 1000 is similar to the ESD protection device 200 and hence, the common features are labelled with the same reference numerals and need not be discussed. As shown in FIG. 10, the ESD protection device 1000 may also include the second, third and fourth conductivity regions 214, 222, 224. However, different from the ESD protection device 200, the first and second isolation elements 230, 232 between the conductivity regions 214, 222, 224 may be absent in the ESD protection device 1000.

Figure 11:
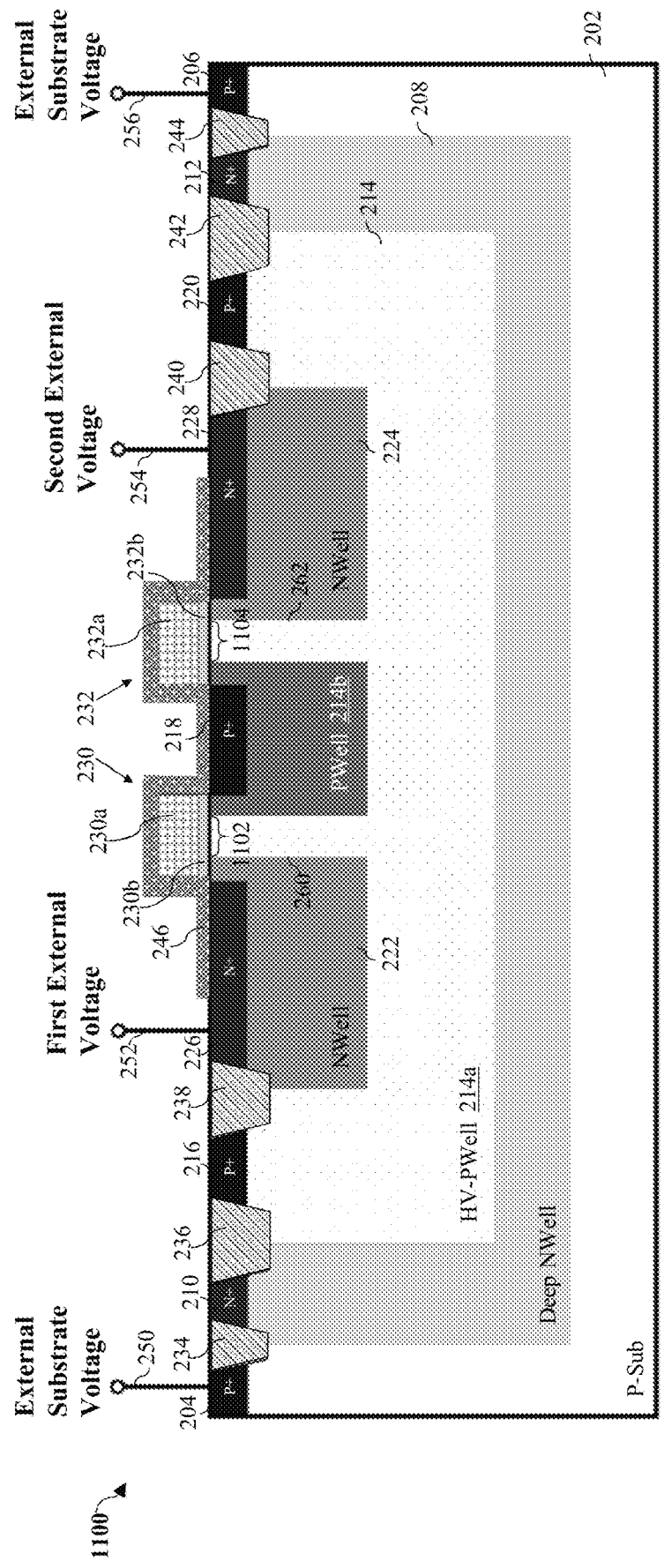
FIG. 11 shows a simplified cross-sectional view of an ESD protection device according to alternative non-limiting embodiments.

FIG. 11 shows a simplified cross-sectional view of an ESD protection device 1100 according to alternative non-limiting embodiments. The ESD protection device 1100 is similar to the ESD protection device 200 and hence, the common features are labelled with the same reference numerals and need not be discussed. As shown in FIG. 11, instead of STI regions, the first and second isolation elements 230, 232 may include first and second gate structures 230, 232, where each gate structure 230, 232 may include a gate electrode 230a, 232a and a gate oxide layer 230b, 232b. The silicide blocking layer 246 may be arranged over a top surface of the substrate 202 and the gate structures 230, 232. The first gate structure 230 may be configured to control a first channel region 1102 between the third conductivity region 222 and the second segment 214b of the second conductivity region 214; whereas the second gate structure 232 may be configured to control a second channel region 1104 between the fourth conductivity region 224 and the second segment 214b of the second conductivity region 214. The control of these channel regions 1102, 1104 by these gate structures 230, 232 may help to control a degree of isolation between the second conductivity region 214, and the third and fourth conductivity regions 222, 224.

Figure 12:
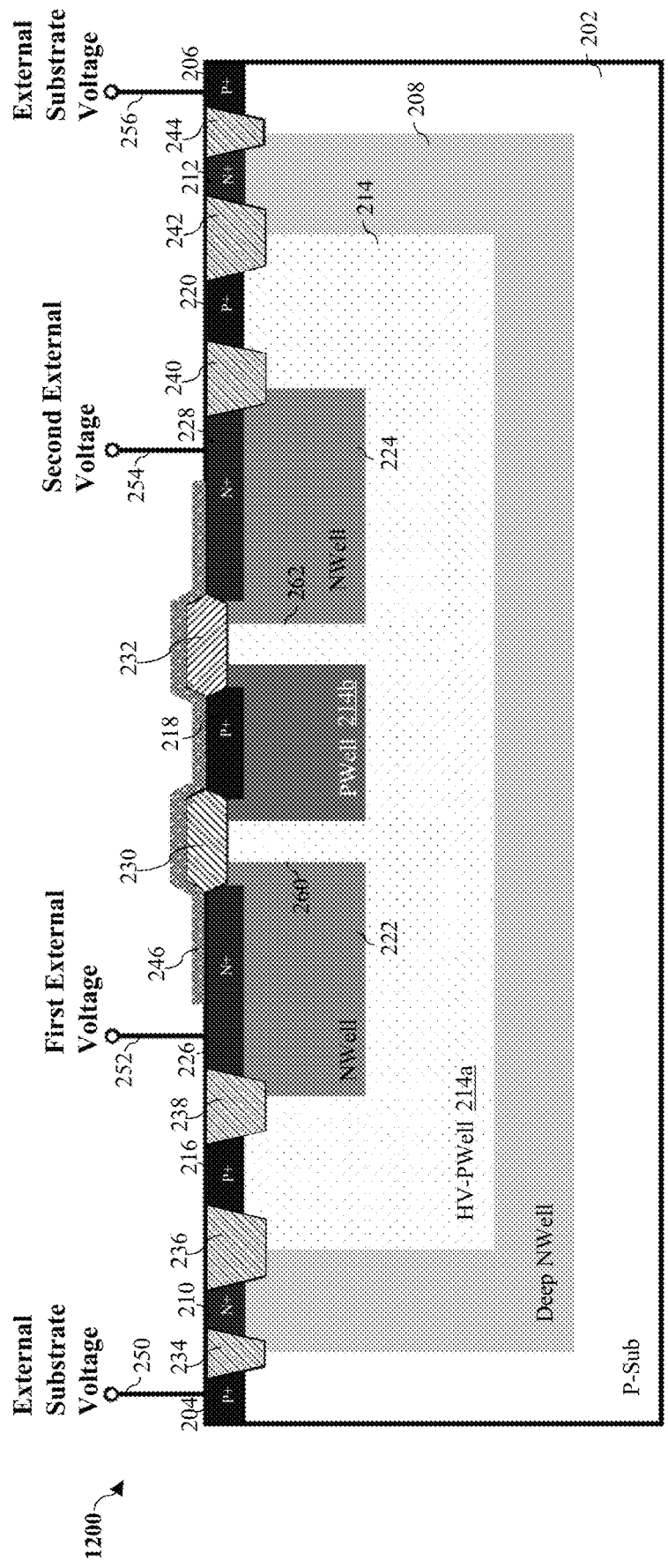
FIG. 12 shows a simplified cross-sectional view of an ESD protection device according to alternative non-limiting embodiments.

FIG. 12 shows a simplified cross-sectional view of an ESD protection device 1200 according to alternative non-limiting embodiments. The ESD protection device 1200 is similar to the ESD protection device 200 and hence, the common features are labelled with the same reference numerals and need not be discussed. As shown in FIG. 12, the first and second isolation elements 230, 232 in the ESD protection device 1200 may include a first field oxide region 230 and a second field oxide region 232. The field oxide regions 230, 232 may be at least partially arranged within the substrate 202. For example, in the non-limiting exemplary embodiment in FIG. 12, each field oxide region 230, 232 may include a part arranged within the substrate 202 and another part arranged to protrude beyond a top surface of the substrate 202. The silicide blocking layer 246 may be arranged over the top surface of the substrate 202 and the field oxide regions 230, 232.

The following examples pertain to further embodiments.

Example 1 may be an electrostatic discharge (ESD) protection device including: a substrate; a first conductivity region arranged at least partially within the substrate; a second conductivity region arranged at least partially within the first conductivity region; a third conductivity region and a fourth conductivity region arranged at least partially within the second conductivity region; and a first terminal portion arranged at least partially within the third conductivity region and a second terminal portion arranged at least partially within the fourth conductivity region. The third conductivity region and the fourth conductivity region may be spaced apart from each other. The substrate and the second conductivity region may have a first conductivity type, and the first conductivity region, third conductivity region, fourth conductivity region, first terminal portion and second terminal portion may have a second conductivity type different from the first conductivity type. The first terminal portion may have a higher doping concentration than the third conductivity region and the second terminal portion may have a higher doping concentration than the fourth conductivity region.

In Example 2, the subject matter of Example 1 may optionally include that the second conductivity region may include a first segment and a second segment, wherein the second segment may be arranged between the third conductivity region and the fourth conductivity region, and wherein the second segment may have a higher doping concentration than the first segment.

In Example 3, the subject matter of Example 2 may optionally include that the ESD protection device may further include a first isolation element arranged between the third conductivity region and the second segment of the second conductivity region, and a second isolation element arranged between the fourth conductivity region and the second segment of the second conductivity region.

In Example 4, the subject matter of Example 2 or Example 3 may optionally include that a depth of the second segment of the second conductivity region may be substantially the same as a depth of the third conductivity region and the fourth conductivity region.

In Example 5, the subject matter of any one of Examples 1 to 4 may optionally include that the first conductivity region may include a buried layer arranged between the second conductivity region and the substrate.

In Example 6, the subject matter of any one of Examples 1 to 5 may optionally include that the ESD protection device may further include a fifth conductivity region arranged at least partially within the second conductivity region, wherein the fifth conductivity region may have the second conductivity type.

In Example 7, the subject matter of Example 6 may optionally include that the second conductivity region may include a first segment, a second segment and a third segment; wherein the second segment may be arranged between the third conductivity region and the fourth conductivity region, and the third segment may be arranged between the fourth conductivity region and the fifth conductivity region; and wherein the second segment and the third segment may have higher doping concentrations than the first segment.

In Example 8, the subject matter of Example 6 or Example 7 may optionally include that the ESD protection device may further include a sixth conductivity region arranged at least partially within the second conductivity region, wherein the sixth conductivity region may have the second conductivity type.

In Example 9, the subject matter of Example 8 may optionally include that the second conductivity region may include a first segment, a second segment, a third segment and a fourth segment; wherein the second segment may be arranged between the third conductivity region and the fourth conductivity region, wherein the third segment may be arranged between the fourth conductivity region and the fifth conductivity region, wherein the fourth segment may be arranged between the fifth conductivity region and the sixth conductivity region; and wherein the second segment, the third segment and the fourth segment may have higher doping concentrations than the first segment.

In Example 10, the subject matter of any one of Examples 1 to 9 may optionally include that the first conductivity region may include a deep well.

In Example 11, the subject matter of any one of Examples 1 to 10 may optionally include that the second conductivity region may include a high voltage well.

In Example 12, the subject matter of any one of Examples 1 to 11 may optionally include that the first conductivity type may be P type and the second conductivity type may be N type.

In Example 13, the subject matter of any one of Examples 1 to 12 may optionally include that the first terminal portion and the second terminal portion may be configured for connection to a first external voltage and a second external voltage, respectively; and wherein the ESD protection device may be configured such that when a difference between the first external voltage and the second external voltage exceeds a predetermined threshold, a first discharge current may pass through the second conductivity region between the third conductivity region and the fourth conductivity region, and the first discharge current may cause a second discharge current to pass through the second conductivity region between the first conductivity region and the third conductivity region, or through the second conductivity region between the first conductivity region and the fourth conductivity region.

In Example 14, the subject matter of any one of Examples 1 to 13 may optionally include that the ESD protection device may be further configured to connect to an apparatus that is to be protected by the ESD protection device, wherein the apparatus may be configured to connect to the first terminal portion and the second terminal portion; and wherein the first conductivity region and the second conductivity region may be set to float.

In Example 15, the subject matter of Example 13 or Example 14 may optionally include that the ESD protection device may further include a fifth conductivity region arranged at least partially within the second conductivity region, wherein the fifth conductivity region may have the second conductivity type, and a third terminal portion arranged at least partially within the fifth conductivity region, wherein the third terminal portion may be configured for connection to a third external voltage.

In Example 16, the subject matter of Example 15 may optionally include that the first terminal portion of the ESD protection device may be connected to a ground pad of the apparatus, the second terminal portion of the ESD protection device may be connected to an input/output pad of the apparatus and the third terminal portion of the ESD protection device may be connected to a general power supply voltage pad of the apparatus.

In Example 17, the subject matter of Example 15 or Example 16 may optionally include that the ESD protection device may further include a sixth conductivity region arranged at least partially within the second conductivity region, wherein the sixth conductivity region may have the second conductivity type; and a fourth terminal portion arranged at least partially within the sixth conductivity region, wherein the fourth terminal portion may be configured for connection to a fourth external voltage.

In Example 18, the subject matter of Example 17 may optionally include that the first terminal portion of the ESD protection device and the fourth terminal portion of the ESD protection device may be connected to a same voltage pad of the apparatus.

In Example 19, the subject matter of Example 17 or Example 18 may optionally include that one of the terminal portions of the ESD protection device may be connected to a general power supply voltage pad of the apparatus and one of the terminal portions of the ESD protection device may be connected to a ground pad of the apparatus, and wherein only the second conductivity region may be arranged between the terminal portion connected to the general power supply voltage pad and the terminal portion connected to the ground pad.

Example 20 may be a method including: providing a substrate; forming a first conductivity region at least partially within the substrate; forming a second conductivity region at least partially within the first conductivity region; forming a third conductivity region and a fourth conductivity region at least partially within the second conductivity region; and forming a first terminal portion at least partially within the third conductivity region and a second terminal portion at least partially within the fourth conductivity region. The third conductivity region and the fourth conductivity region may be spaced apart from each other. The substrate and the second conductivity region may have a first conductivity type, and the first conductivity region, third conductivity region, fourth conductivity region, first terminal portion and second terminal portion may have a second conductivity type different from the first conductivity type. The first terminal portion may have a higher doping concentration than the third conductivity region and the second terminal portion may have a higher doping concentration than the fourth conductivity region.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An electrostatic discharge (ESD) protection device comprising:
   a substrate;
   a first conductivity region arranged at least partially within the substrate;
   a second conductivity region arranged at least partially within the first conductivity region;
   a third conductivity region and a fourth conductivity region arranged at least partially within the second conductivity region, wherein the third conductivity region and the fourth conductivity region are spaced apart from each other; and
   a first terminal portion arranged at least partially within the third conductivity region and a second terminal portion arranged at least partially within the fourth conductivity region;
   wherein the substrate and the second conductivity region has a first conductivity type, and wherein the first conductivity region, third conductivity region, fourth conductivity region, first terminal portion and second terminal portion have a second conductivity type different from the first conductivity type; and
   wherein the first terminal portion has a higher doping concentration than the third conductivity region and the second terminal portion has a higher doping concentration than the fourth conductivity region.

2. The ESD protection device according to claim 1, wherein the second conductivity region comprises a first segment and a second segment, wherein the second segment is arranged between the third conductivity region and the fourth conductivity region, and wherein the second segment has a higher doping concentration than the first segment.

3. The ESD protection device according to claim 2, wherein the ESD protection device further comprises a first isolation element arranged between the third conductivity region and the second segment of the second conductivity region, and a second isolation element arranged between the fourth conductivity region and the second segment of the second conductivity region.

4. The ESD protection device according to claim 2, wherein a depth of the second segment of the second conductivity region is substantially the same as a depth of the third conductivity region and the fourth conductivity region.

5. The ESD protection device according to claim 1, wherein the first conductivity region comprises a buried layer arranged between the second conductivity region and the substrate.

6. The ESD protection device according to claim 1, further comprising a fifth conductivity region arranged at least partially within the second conductivity region, wherein the fifth conductivity region has the second conductivity type.

7. The ESD protection device according to claim 6, wherein the second conductivity region comprises a first segment, a second segment and a third segment;
wherein the second segment is arranged between the third conductivity region and the fourth conductivity region, and the third segment is arranged between the fourth conductivity region and the fifth conductivity region; and
wherein the second segment and the third segment have higher doping concentrations than the first segment.

8. The ESD protection device according to claim 6, further comprising a sixth conductivity region arranged at least partially within the second conductivity region, wherein the sixth conductivity region has the second conductivity type.

9. The ESD protection device according to claim 8, wherein the second conductivity region comprises a first segment, a second segment, a third segment and a fourth segment;
wherein the second segment is arranged between the third conductivity region and the fourth conductivity region, wherein the third segment is arranged between the fourth conductivity region and the fifth conductivity region, wherein the fourth segment is arranged between the fifth conductivity region and the sixth conductivity region; and
wherein the second segment, the third segment and the fourth segment have higher doping concentrations than the first segment.

10. The ESD protection device according to claim 1, wherein the first conductivity region comprises a deep well.

11. The ESD protection device according to claim 1, wherein the second conductivity region comprises a high voltage well.

12. The ESD protection device according to claim 1, wherein the first conductivity type is P type and the second conductivity type is N type.

13. The ESD protection device according to claim 1, wherein the first terminal portion and the second terminal portion are configured for connection to a first external voltage and a second external voltage, respectively; and
wherein the ESD protection device is configured such that when a difference between the first external voltage and the second external voltage exceeds a predetermined threshold, a first discharge current passes through the second conductivity region between the third conductivity region and the fourth conductivity region, and the first discharge current causes a second discharge current to pass through the second conductivity region between the first conductivity region and the third conductivity region, or through the second conductivity region between the first conductivity region and the fourth conductivity region.

14. The ESD protection device according to claim 1, wherein the ESD protection device is further configured to connect to an apparatus that is to be protected by the ESD protection device, wherein the apparatus is configured to connect to the first terminal portion and the second terminal portion; and
wherein the first conductivity region and the second conductivity region are set to float.

15. The ESD protection device according to claim 13, further comprising:
a fifth conductivity region arranged at least partially within the second conductivity region, wherein the fifth conductivity region has the second conductivity type, and
a third terminal portion arranged at least partially within the fifth conductivity region, wherein the third terminal portion is configured for connection to a third external voltage.

16. The ESD protection device according to claim 15, wherein the first terminal portion of the ESD protection device is connected to a ground pad of the apparatus, the second terminal portion of the ESD protection device is connected to an input/output pad of the apparatus and the third terminal portion of the ESD protection device is connected to a general power supply voltage pad of the apparatus.

17. The ESD protection device according to claim 15, further comprising:
a sixth conductivity region arranged at least partially within the second conductivity region, wherein the sixth conductivity region has the second conductivity type; and
a fourth terminal portion arranged at least partially within the sixth conductivity region, wherein the fourth terminal portion is configured for connection to a fourth external voltage.

18. The ESD protection device according to claim 17, wherein the first terminal portion of the ESD protection device and the fourth terminal portion of the ESD protection device are connected to a same voltage pad of the apparatus.

19. The ESD protection device according to claim 17, wherein one of the terminal portions of the ESD protection device is connected to a general power supply voltage pad of the apparatus and one of the terminal portions of the ESD protection device is connected to a ground pad of the apparatus, and wherein only the second conductivity region is arranged between the terminal portion connected to the general power supply voltage pad and the terminal portion connected to the ground pad.

20. A method comprising:

providing a substrate;

forming a first conductivity region at least partially within the substrate;

forming a second conductivity region at least partially within the first conductivity region;

forming a third conductivity region and a fourth conductivity region at least partially within the second conductivity region, wherein the third conductivity region and the fourth conductivity region are spaced apart from each other; and forming a first terminal portion at least partially within the third conductivity region and a second terminal portion at least partially within the fourth conductivity region;

wherein the substrate and the second conductivity region has a first conductivity type, and wherein the first conductivity region, third conductivity region, fourth conductivity region, first terminal portion and second terminal portion have a second conductivity type different from the first conductivity type; and wherein the first terminal portion has a higher doping concentration than the third conductivity region and the second terminal portion has a higher doping concentration than the fourth conductivity region.

* * * * *